(12) United States Patent
Hudson et al.

(10) Patent No.: US 11,739,437 B2
(45) Date of Patent: Aug. 29, 2023

(54) RESISTIVITY STABILIZATION MEASUREMENT OF FAT NECK SLABS FOR HIGH RESISTIVITY AND ULTRA-HIGH RESISTIVITY SINGLE CRYSTAL SILICON INGOT GROWTH

(71) Applicant: GlobalWafers Co., Ltd, Hsinchu (TW)

(72) Inventors: Carissima Marie Hudson, St. Charles, MO (US); HyungMin Lee, Chungcheongnam-do (KR); JaeWoo Ryu, Chesterfield, MO (US); Richard J. Phillips, St. Peters, MO (US); Robert Wendell Standley, Chesterfield, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 102 days.

(21) Appl. No.: 16/710,888

(22) Filed: Dec. 11, 2019

(65) Prior Publication Data

US 2020/0208294 A1 Jul. 2, 2020

Related U.S. Application Data

(60) Provisional application No. 62/785,432, filed on Dec. 27, 2018.

(51) Int. Cl.
*C30B 15/02* (2006.01)
*C30B 15/10* (2006.01)
(Continued)

(52) U.S. Cl.
CPC .............. *C30B 15/02* (2013.01); *C30B 15/10* (2013.01); *C30B 15/14* (2013.01); *C30B 29/06* (2013.01); *C30B 33/02* (2013.01)

(58) Field of Classification Search
CPC ......... C30B 15/02; C30B 15/04; C30B 15/10; C30B 15/14; C30B 15/20; C30B 29/06; C30B 33/02
See application file for complete search history.

(56) References Cited

U.S. PATENT DOCUMENTS 5,449,883 A * 9/1995 Tsuruta ............... H01L 21/6776
219/486
8,317,919 B2 11/2012 Bender
(Continued)

FOREIGN PATENT DOCUMENTS

CN 102181919 A * 9/2011
CN 102181919 A 9/2011
(Continued)

OTHER PUBLICATIONS

SEMI MF84-0307, ASTM International: "Test Method for Measuring Resistivity of Silicon Wafers with an In-Line Four-Point Probe", SEMI MF84-0307, 2005, 19pgs (Year: 2005).*
(Continued)

*Primary Examiner* — Hua Qi
(74) *Attorney, Agent, or Firm* — Armstrong Teasdale LLP

(57) ABSTRACT

Methods for forming single crystal silicon ingots with improved resistivity control are disclosed. The methods involve growth of a sample rod. The sample rod may have a diameter less than the diameter of the product ingot. The sample rod is cropped to form a center slab. The resistivity of the center slab may be measured directly such as by a four-point probe. The sample rod or optionally the center slab may be annealed in a thermal donor kill cycle prior to measuring the resistivity, and the annealed rod or slab is irradiated with light in order to enhance the relaxation rate and enable more rapid resistivity measurement.

17 Claims, 20 Drawing Sheets

(51) Int. Cl.
*C30B 15/14* (2006.01)
*C30B 29/06* (2006.01)
*C30B 33/02* (2006.01)

(56) References Cited

U.S. PATENT DOCUMENTS

| | | | | |
|---|---|---|---|---|
| 2005/0183660 | A1* | 8/2005 | Furukawa | C30B 29/06 |
| | | | | 117/14 |
| 2006/0263967 | A1* | 11/2006 | Falster | H01L 21/324 |
| | | | | 257/E21.321 |
| 2007/0190809 | A1* | 8/2007 | Tanahashi | H01L 21/3225 |
| | | | | 257/E21.321 |
| 2008/0128851 | A1* | 6/2008 | Aga | H01L 21/76254 |
| | | | | 438/459 |
| 2014/0038316 | A1* | 2/2014 | Fulle | H01L 22/24 |
| | | | | 250/341.4 |
| 2018/0237937 | A1* | 8/2018 | Kang | C30B 15/04 |

FOREIGN PATENT DOCUMENTS

| | | |
|---|---|---|
| GB | 2137524 A | 10/1984 |
| JP | S6395629 A | 4/1988 |
| JP | 2012129308 A | 7/2012 |
| JP | 2013142054 A | 7/2013 |
| WO | 2018125958 A1 | 7/2018 |
| WO | 2020005901 A1 | 1/2020 |

OTHER PUBLICATIONS

Lin, Hui-Wang et al., Technology of Infrared Rapid Thermal Annealing and Its Application in VLSI, Institute of Microelectronics, Nov. 6, 1995, pp. 285-286.

International Search and Written Opinion of the International Searching Authority regarding PCT/US2019/066187 dated Mar. 20, 2020; pp. 1-14.

ASTM International: "Standard Test Method for Resistivity of Silicon Bars Using a Two-Point Probe", Designation F 397-02, 11 pgs, available before Jun. 27, 2018.

ASTM International: "Test Methods For Conductivity Type of Extrinsic Semiconducting Materials", Edition SEMI MF42-1105, 2005, 9 pgs.

U.S. Appl. No. 16/020,698 entitled, Sample Rod Growth and Resistivity Measurement During Single Crystal Silicon Ingot Production, filed Jun. 27, 2018, pp. 1-23 pgs.

Cho, C. R. et al.; Evolution of deep-level centers in p-type silicon following ion implantation at 85K; Applied Physics Letters, Mar. 1, 1999, pp. 1263-1265, vol. 74, No. 9, American Institute of Physics.

U.S. Appl. No. 16/230,473 entitled, Sample Rod Center Slab Resistivity Measurement During Single Crystal Silicon Ingot Production, filed Dec. 21, 2018, pp. 1-29.

U.S. Appl. No. 16/020,695, entitled Methods for Determining the Resistivity of a Polycrystalline Silicon Melt, filed Jun. 27, 2018; 21 pages.

ASTM International: "Test Methods For Resistivity of Semiconductor Materials", SEMI MF43-0705, 2003, 10 pgs.

ASTM International: "Standard Test Method for Sheet Resistance Uniformity Evaluation by In-Line Four-Point Probe with the Dual-Configuration Procedure", SEMI F1529-97, 1997, 12 pgs.

ASTM International: "Test Method for Measuring Resistivity of Silicon Wafers with an In-Line Four-Point Probe", SEMI MF84-0307, 2005, 19 pgs.

Extended European Search Report, Application No. 23158726.2 dated Apr. 28, 2023 (6 pages).

* cited by examiner

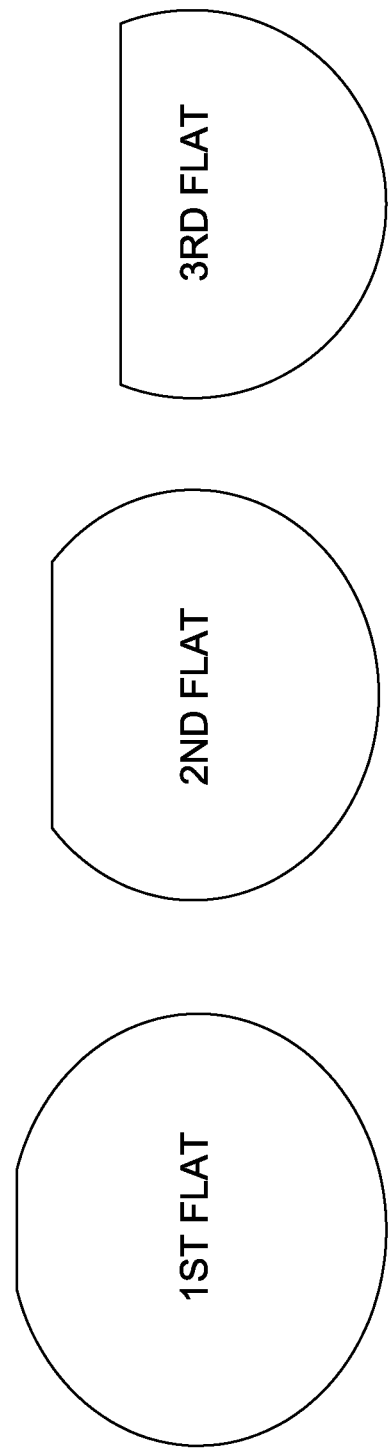

RESISTIVITY STABILIZATION MEASUREMENT OF FAT NECK SLABS FOR HIGH RESISTIVITY AND ULTRA-HIGH RESISTIVITY SINGLE CRYSTAL SILICON INGOT GROWTH

CROSS REFERENCE TO RELATED APPLICATION(S)

This application claims priority to U.S. provisional application Ser. No. 62/785,432, which was filed Dec. 27, 2018, the disclosure of which is hereby incorporated by reference as if set forth in its entirety.

FIELD OF THE DISCLOSURE

The field of the disclosure relates to methods for forming single crystal silicon ingots with improved resistivity control and, in particular, methods that involve growth and resistivity measurement of a center slab cropped from a sample rod having a diameter less than a product ingot.

BACKGROUND

Single crystal silicon, which is the starting material for most processes for the fabrication of semiconductor electronic components, is commonly prepared by the so-called Czochralski (CZ) process wherein a single seed crystal is immersed into molten silicon and then grown by slow extraction. Molten silicon is contaminated with various impurities, among which is mainly oxygen, during the time it is contained in a quartz crucible. Some applications, such as advanced wireless communication applications, insulated gate bipolar transistors (IGBT) and low power, low leakage devices, require wafers with a relatively high resistivity such as 1500 ohm-cm (Ω-cm) or more.

Highly pure polycrystalline silicon is used for high resistivity ingot production. Highly pure polycrystalline silicon is characterized by a spread in the impurity profile which causes a wide spread in the intrinsic resistivity range of the un-doped material and its type. Targeting of the seed-end resistivity in such high or ultra-high resistivity materials is difficult due to the variability of boron and phosphorous in the starting material (including surface boron and phosphorous in the polycrystalline silicon material) and due to impurities in the crucible, and/or oxygen levels which alter the resistivity after a thermal donor kill cycle. Further, such high resistivity applications may be susceptible to increased error in resistivity measurement.

A need exists for methods for preparing high resistivity silicon ingots that allow the impurity concentration and/or resistivity of the polycrystalline silicon starting material to be sampled relatively quickly and reliably with a relatively small amount of silicon being consumed for resistivity measurement.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

The present application provides a method of controlling resistivity of a single crystal silicon ingot grown by the Czochralski method. The method comprises: contacting a silicon seed crystal with a silicon melt, wherein the silicon melt is contained within a crucible and comprises molten silicon; withdrawing the silicon seed crystal from the silicon melt to form a sample rod comprising single crystal silicon, the sample rod having a generally cylindrical shape and comprising a central axis; a circumferential edge; and a radius extending from the central axis to the circumferential edge; slicing a slab from the sample rod, the slab comprising a longitudinal plane encompassing at least a portion of the central axis of the sample rod and having a thickness; annealing the slab to annihilate thermal donors; lapping the slab; irradiating the slab with infrared light; and measuring a resistivity of the slab after the slab temperature has declined to less than 30° C.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 8A is a schematic top view of three sample rods that were successively ground to form planar segments (flats).

FIG. 13 is a graph depicting the temperature profile of the fat neck center slab during irradiation. Time zero is when the IR lamp is turned on.

Corresponding reference characters indicate corresponding parts throughout the drawings.

DETAILED DESCRIPTION

Provisions of the present disclosure are directed to methods for producing a single crystal silicon ingot by the Czochralski method in which a sample rod is grown to determine the resistivity of the melt. The sample rod has a diameter less than the product ingot. The sample rod is slabbed and the resistivity of the slab is measured such as by a four-point probe. In some embodiments, the resistivity of the slab is measured after irradiation, e.g., irradiation in infrared light. Irradiation has the effect of facilitating resistivity relaxation, which thereby allows for more rapid resistivity measurement.

Figure 1:
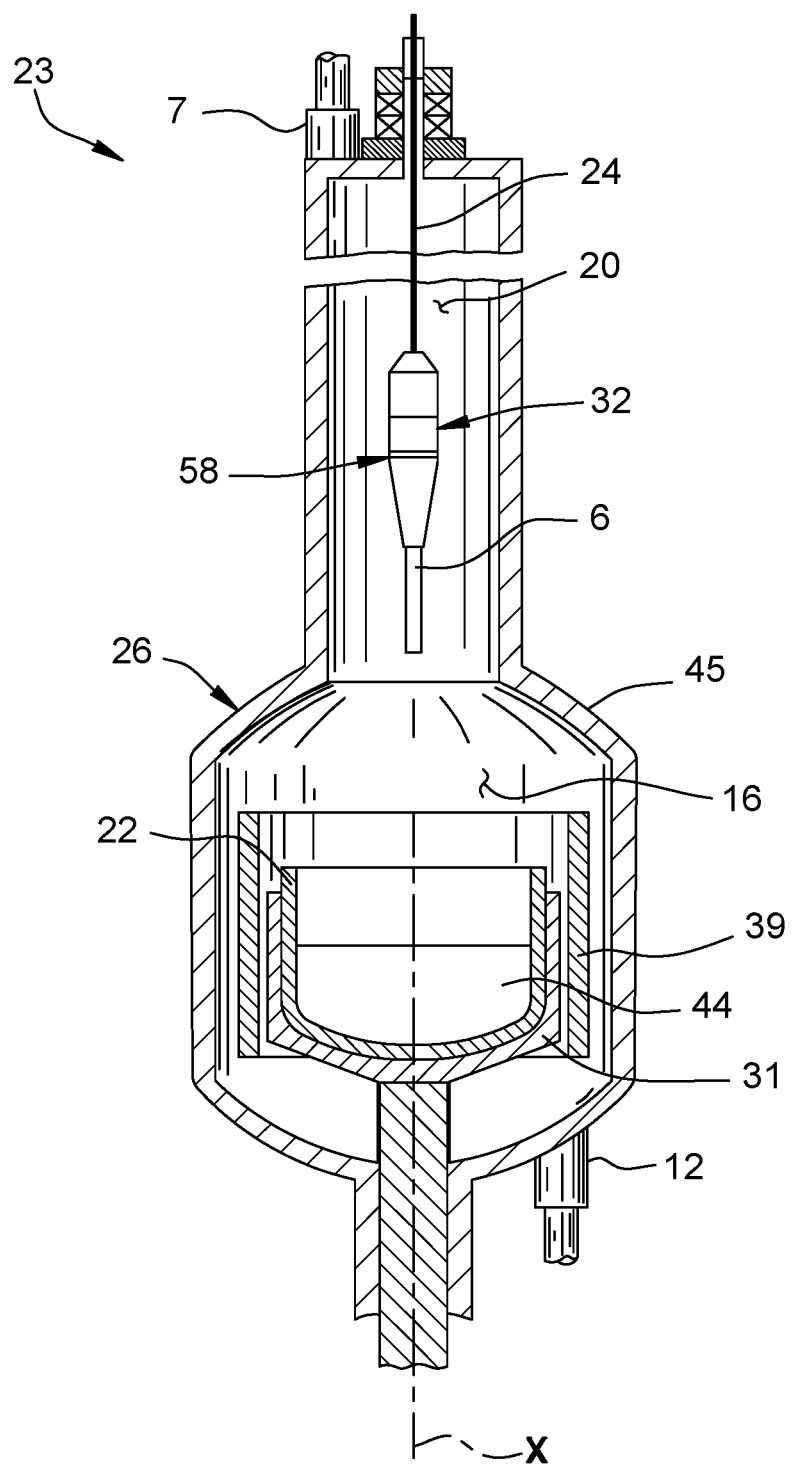
FIG. 1 is a schematic side view of a pulling apparatus for forming a single crystal silicon ingot.

In accordance with embodiments of the present disclosure and with reference to FIG. 1, the product ingot is grown by the so-called Czochralski process in which the ingot is withdrawn from a silicon melt 44 held within a crucible 22 of an ingot puller 23. The ingot puller 23 includes a housing 26 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The ingot puller 23 includes an inlet port 7 and an outlet port 12 which may be used to introduce and remove a process gas to and from the housing 26 during crystal growth.

The crucible 22 within the ingot puller 23 contains the silicon melt 44 from which a silicon ingot is drawn. The silicon melt 44 is obtained by heating the polycrystalline silicon charged to the crucible 22 to cause it to melt. The crucible 22 is mounted on a turntable 31 for rotation of the crucible 22 about a central longitudinal axis X of the ingot puller 23.

A heating system 39 (e.g., an electrical resistance heater) surrounds the crucible 22 for melting the silicon charge to produce the melt 44. The heating system 39 may also extend below the crucible as shown in U.S. Pat. No. 8,317,919. The heating system 39 is controlled by a control system (not shown) so that the temperature of the melt 44 is precisely controlled throughout the pulling process. Insulation (not shown) surrounding the heating system 39 may reduce the amount of heat lost through the housing 26. The ingot puller 23 may also include a heat shield assembly (not shown) above the melt surface for shielding the ingot from the heat of the crucible 22 to increase the axial temperature gradient at the solid-melt interface.

A pulling mechanism (not shown) is attached to a pull wire 24 that extends down from the mechanism. The mechanism is capable of raising and lowering the pull wire 24. The ingot puller 23 may have a pull shaft rather than a wire, depending upon the type of puller. The pull wire 24 terminates in a pulling assembly 58 that includes a seed crystal chuck 32 which holds a seed crystal 6 used to grow the silicon ingot. In growing the ingot, the pulling mechanism lowers the seed crystal 6 until it contacts the surface of the silicon melt 44. Once the seed crystal 6 begins to melt, the pulling mechanism slowly raises the seed crystal up through the growth chamber 16 and pull chamber 20 to grow the monocrystalline ingot. The speed at which the pulling mechanism rotates the seed crystal 6 and the speed at which the pulling mechanism raises the seed crystal (i.e., the pull rate v) are controlled by the control system.

A process gas is introduced through the inlet port 7 into the housing 26 and is withdrawn from the outlet port 12. The process gas creates an atmosphere within the housing 26 and the melt and atmosphere form a melt-gas interface. The outlet port 12 is in fluid communication with an exhaust system (not shown) of the ingot puller.

In this regard, the ingot puller 23 shown in FIG. 1 and described herein is exemplary and other crystal puller configurations and arrangements may be used to pull a single crystal silicon ingot from a melt unless stated otherwise.

Figure 2:
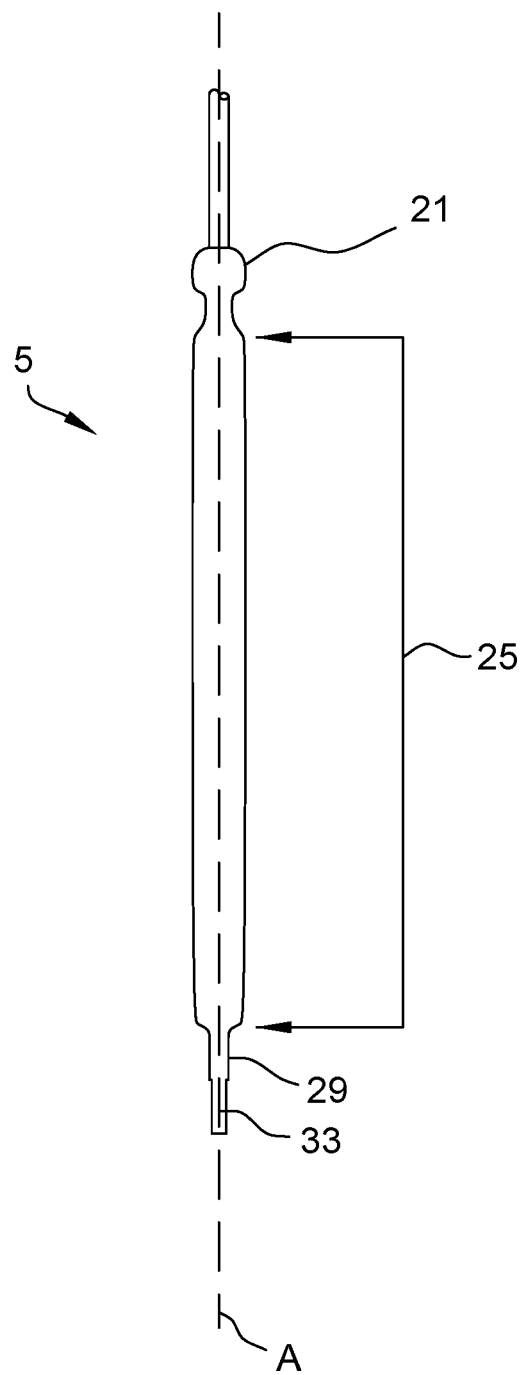
FIG. 2 is a sample rod grown from a silicon melt.

In accordance with embodiments of the present disclosure, after polycrystalline silicon is added to the crucible 22 and the heating system 39 is operated to melt-down the polycrystalline silicon, a sample ingot or rod is pulled from the melt. An example sample rod 5 is shown in FIG. 2. The rod 5 includes a crown portion 21 in which the rod transitions and tapers outward from the seed to reach a target diameter. The rod 5 includes a central axis A and a constant diameter portion 25 or cylindrical main body or simply "body", of the crystal which is grown by increasing the pull rate. The main body 25 of the sample rod 5 has a relatively constant diameter. The rod 5 includes a tail or end-cone 29 in which the rod tapers in diameter after the main body 25. When the diameter becomes small enough, the rod 5 is then separated from the melt. The rod 5 has a central longitudinal axis A that extends through the crown 21 and a terminal end 33 of the ingot.

The growth conditions of the sample rod 5 may be selected from generally any of the suitable growth conditions available to those of skill in the art. The sample rod 5 may be a single crystal with a body of the sample rod having zero dislocations. The sample rod 5 may be grown with a locked seed lift (i.e., fixed pull speed with varying diameter such as +/- about 5 mm) or active seed lift (pull speed varied to maintain target diameter).

The sample rod 5 has a diameter less than the product ingot that is grown after the sample rod. For example, the diameter of the sample rod may be less than 0.75 times the diameter of the product ingot, less than 0.50 times, less than about 0.25 times or less than 0.1 times the diameter of the product ingot. In some embodiments, the diameter of the sample rod is less than about 150 mm or less than about 100 mm, less than about 50 mm, less than about 25 mm, or less than about 20 mm (e.g., from about 5 mm to about 150 mm, from about 5 mm to about 100 mm, from about 5 mm to about 50 mm, from about 5 mm to about 25 mm or from about 10 mm to about 25 mm). Generally, the diameter of the rod 5 is measured by measuring the rod along several axial locations (e.g., within a constant diameter portion of the rod if the rod has a crown and/or tapered end) and averaging the measured diameters (e.g., measuring 2, 4, 6, 10 or more diameters along the length and averaging). In some embodiments, the largest diameter of the sample rod is less than about 150 mm or less than about 100 mm, less than about 50 mm, less than about 25 mm, or less than about 20 mm (e.g., from about 5 mm to about 150 mm, from about 5 mm to about 100 mm, from about 5 mm to about 50 mm, from about 5 mm to about 25 mm or from about 10 mm to about 25 mm).

In some embodiments, the rod 5 has a diameter that generally corresponds to the diameter of the neck portion of a product ingot grown in the crystal puller. For example, the rod may have a diameter of less than 50 mm, less than 25 mm, or less than 20 mm, such as about 17 mm.

The sample rod 5 may have any suitable length. In some embodiments, the rod (e.g., after cropping) has a length between about 100 millimeters and about 500 millimeters in length, such as between about 150 millimeters and about 300 millimeters in length, such as about 200 millimeters in length. In some embodiments, the rod (e.g., after cropping) has a length of less than about 300 mm, less than about 200 mm, or less than about 100 mm (e.g., from about 25 mm to about 300 mm, such as about 200 mm).

Figure 3:
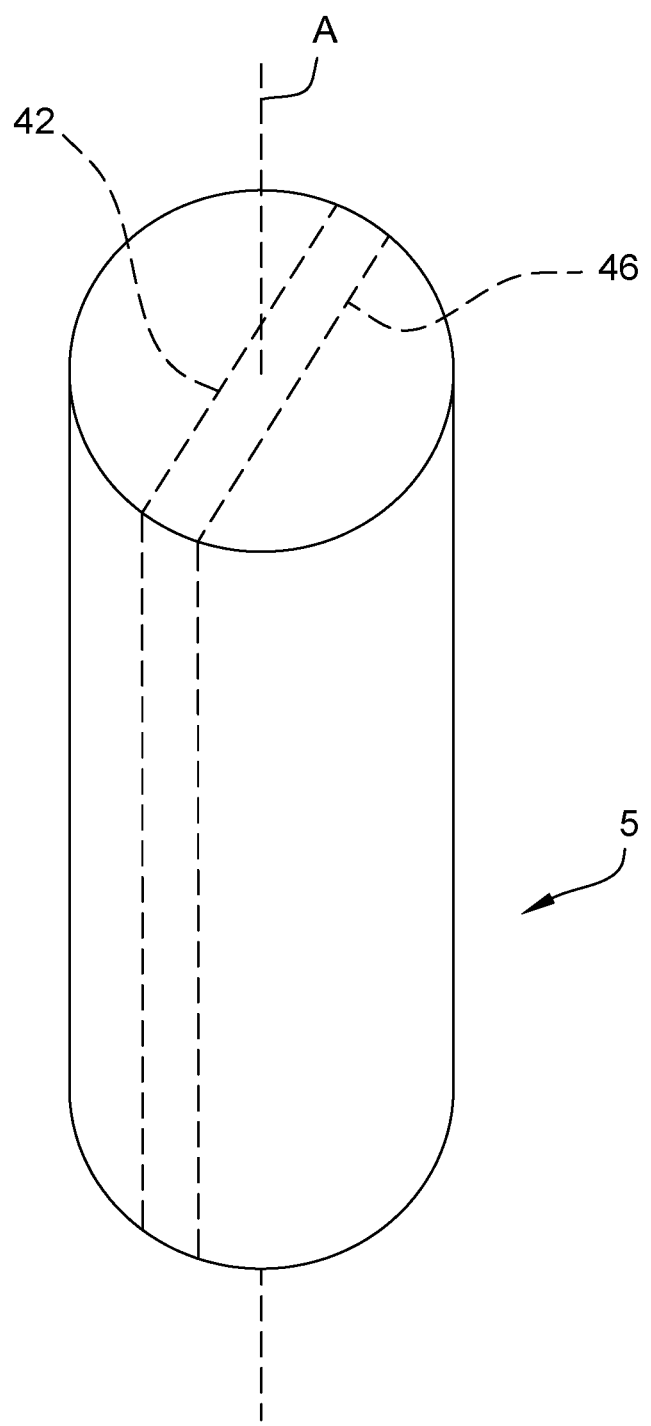
FIG. 3 is a schematic perspective view of a sample rod showing two crop planes along which the rod is cropped to form a center slab.
Figure 4:
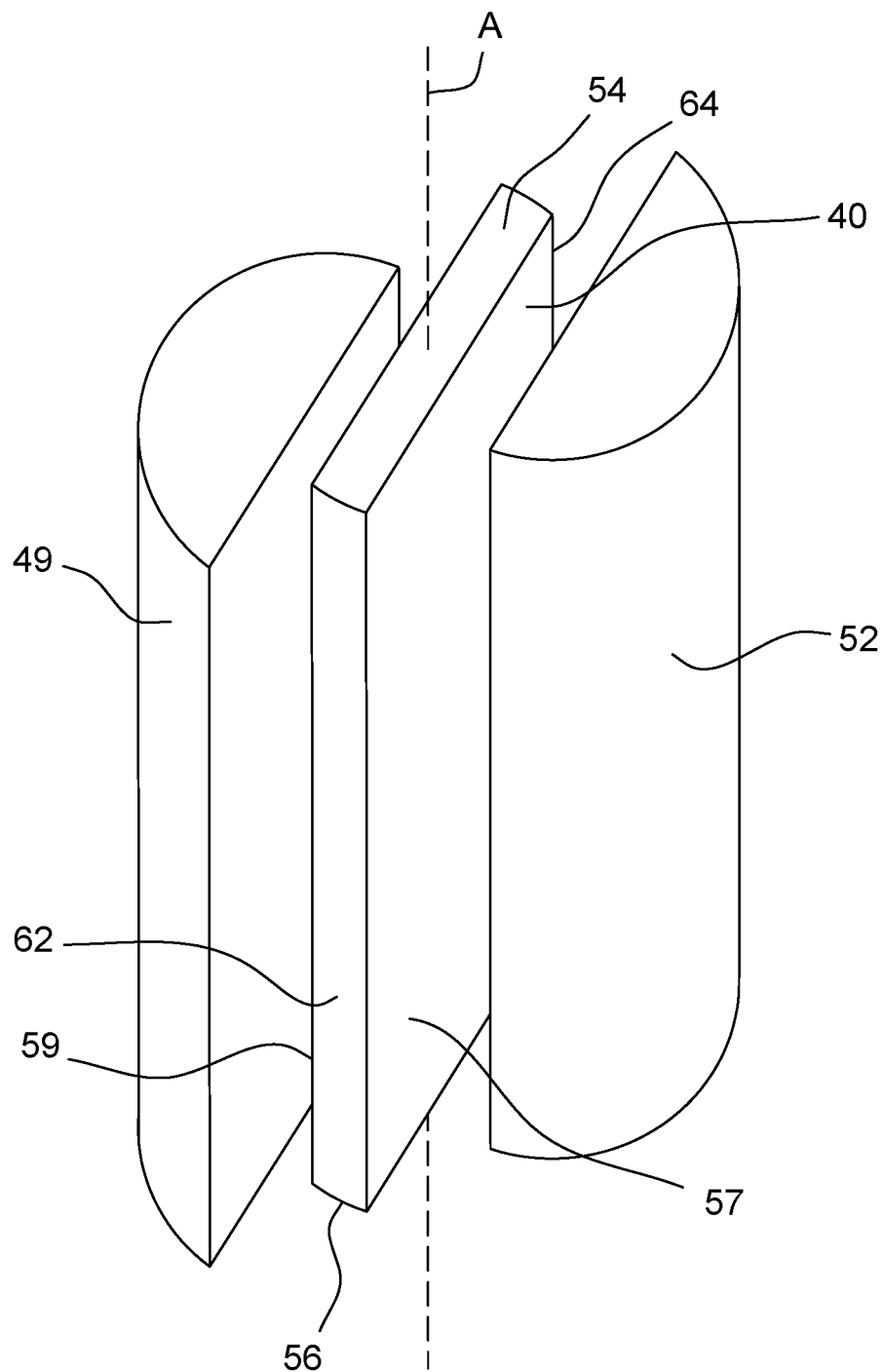
FIG. 4 is a schematic perspective view of a cropped sample rod that includes a center slab.

After the sample rod 5 is grown, the sample rod is processed, e.g., sliced, to form a center slab 40 (FIG. 4). Slicing a center slab 40 from the sample rod 5 enables improved resistivity measurement confidence. The fat neck must be measured as close to the axi-symmetric center as possible where resistivity radial variation is minimal. To achieve this, the fat neck is subsequently sliced into a thin slab down the center (or as close to the widest diameter of the fat neck). The crown and tail of the sample rod 5 may be removed, such as by slicing by use of a wire saw. As shown in FIG. 4, the sample rod 5 is then cropped to form the slab 40. The sample rod 5 may be cropped by a tabletop cutting machine (e.g., Minitom, available from Streuers (Westlake, Ohio)) or by use of a diamond wire saw (e.g., DTW wire saw). The sample rod 5 is cropped along a first crop plane 42 (FIG. 3) and is cropped along a second crop plane 46 to form first and second crop portions 49, 52 (FIG. 4) and the slab 40. The first crop plane 42 and the second crop plane 46 are parallel to each other and are parallel to the central longitudinal axis A of the sample rod 5. The slab 40 may have any suitable thickness for resistivity measurement such as, for example, between about 5 mm and about 0.1 mm, between about 3 mm and about 0.5 mm, between about 3 mm to about 1 mm, between 2 mm and 1 mm or a thickness of about 1.1 mm. The slab 40 may be generally square or rectangular in cross-section. The first and second sides 62, 64 of the slab 40 may be slightly rounded due to the contour of the sample rod 5 or the slab 40 may be further cropped to form planar sides 62, 64.

Generally, the center slab 40 includes at least portion of the central axis A of the uncropped sample rod 5. In some embodiments, the cropping method may be variable to account for axial non-uniformity in the sample rod diameter to allow the center slab 40 to capture as much of the axisymmetric center line of the rod 5 as possible. For example, the center slab 40 may include at least about 10% of the central axis A of the sample rod 5 (i.e., the sample rod just prior to cropping to form the center slab), or at least about 25%, at least about 50%, at least about 75%, or at least about 90% of the central axis A of the sample rod 5. In some embodiments, after cropping, the central axis A of the cropped sample rod 5 extends through the entire length of the center slab 40 (e.g., from first end 54 to second end 56 of the center slab 40).

In some embodiments, the cropped ends of the rod 5 or center slab 40 are ground to flatten the ends. The rod ends may be etched (e.g., mixed acid etched). The center slab 40 may be modified to include ohmic contacts at its first and second ends 54, 56. For example, the first and second ends 54, 56 of the center slab 40 may be painted with a colloidal silver paint and dried.

In some embodiments, the sample rod 5 or a center slab 40 sliced from the sample rod 5 (see FIG. 4) is subjected to a thermal donor annihilating anneal before measuring the resistivity. The thermal donor annihilating anneal may act as a thermal donor kill cycle (i.e., annihilation of thermal donors) by dissociating interstitial oxygen clusters. In some embodiments, the anneal to annihilate thermal donors is performed at a temperature of about 500° C. or more, or greater than about 600° C., about 650° C. or more or about 800° C. or more (e.g., 500° C. to about 1000° C., from about 500° C. to about 900° C. or from about 650° C. to about 1100° C.) for no more than 60 minutes, or 30 minutes and for at least about 5 seconds, at least about 30 seconds, at least about 1 minute or at least about 3 minutes or more (e.g., from about 5 seconds to 15 minutes, from about 5 seconds to about 5 minutes or from about 5 seconds to about 3 minutes). In some embodiments, the anneal to annihilate thermal donors comprises annealing sample rod 5 or a slab 40 sliced from the sample rod 5 to a temperature greater than about 600° C. for no more than 60 minutes, or 30 minutes. In some embodiments, the anneal to annihilate thermal donors comprises annealing sample rod 5 or a slab 40 sliced from the sample rod 5 to a temperature of about 720° C. for about two minutes.

The first and second cropped, planar surfaces 57, 59 of the center slab 40 may be ground to flatten the surfaces. In some embodiments, the center slab 40 is lapped before resistivity measurement to form a lapped surface with reduced surface morphology (e.g., before or after the thermal donor kill cycle). Objectives of lapping include removing subsurface damage in the sliced center slab 40, thinning the center slab 40 to target thickness, and achieving a high degree of parallelism and flatness of surfaces of the center slab 40. Both single-side and double-side lapping processes may be used to lap the center slab 40. In double-side lapping (DSL), loose abrasive particles are suspended in a colloidal slurry to abrade material from surfaces of the center slab 40. The center slab 40 is held in a geared carrier, which is driven in the planetary motion. A batch of center slabs 40 may be manually loaded into the holes of the carriers, the upper plate will be forced down by a certain pressure (or weight), e.g., from about 1 kg to about 30 kg, or from about 5 kg to about 20 kg, such as about 10 kg. The two plates start to rotate either in the same direction or opposite directions. During double-side lapping, both sides of the center slab 40 are lapped simultaneously. The colloidal slurry is continuously filled into the lapping machine, and a thin film of slurry is usually present between center slab 40 and the two plates. The slurry performs the material removal through the abrasive grits as they slide or roll between wafer surfaces and the two plates. The lapping may occur for at least 1 minute, at least 5 minutes, at least 10 minutes, at least 15 minutes, at least 20 minutes, at least 25 minutes, such as about 10 minutes. Lapping parameters including lapping pressure, plate rotation speed, plate material, abrasive material and grain size, slurry concentration, slurry flow rate, and carrier design may be according to conventional techniques.

For example, the particle sizes in the lapping slurry may range from about 1 to about 250 micrometers, such as between about 1 to about 50 micrometers, such as between about 5 and about 20 micrometers. Rotation rates may range from about 10 to about 150 rpm, or about 25 to about 150 rpm, such as about 50 rpm, about 75 rpm, or about 100 rpm. In some embodiments, the center slab 40 may be contacted with an alumina ($Al_2O_3$) slurry. In some embodiments, the center slab 40 may be contacted with a slurry comprising monocrystalline diamond particles. In some embodiments, the center slab 40 may be contacted with a slurry comprising boron carbide particles. In some embodiments, the center slab 40 may be contacted with a slurry comprising silicon carbide particles.

Figure 12:
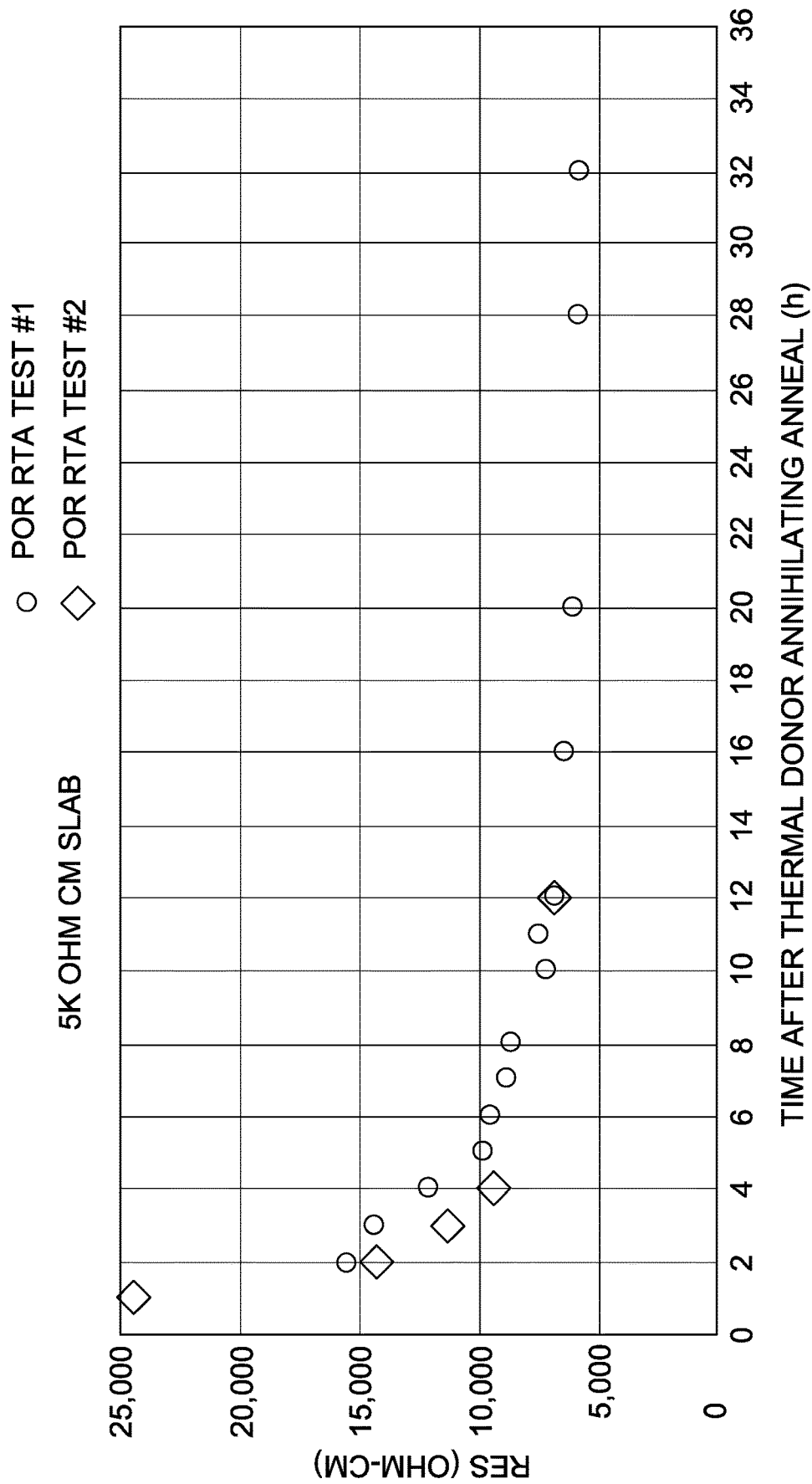
FIG. 12 is a graph depicting resistivity measurements on a ~5K ohm cm center slab as a function of time after the thermal donor annihilating anneal and lapping.

In embodiments wherein the ingot to be grown according to the Czochralski method is targeted to have a high resistivity, it has been observed that an accurate resistivity measured requires a time dependence for relaxation after thermal donor annihilating anneal and lapping to prepare the samples. For example, it can typically require up to 72 hours at room temperature for the resistivity to relax to a stable value. Additional causes of delayed relaxation and stabilization include surface treatment (surface morphology by etching, polishing, grinding, or lapping) can impact the transient profile. These transient effects interfere with measuring the true dopant concentration determination needed to accurately "sample" the polycrystalline silicon. An accurate sampling resistivity measurement is required to determine if additional dopant is required to the silicon melt when growing single crystal silicon ingots targeted for prime rod for HR (High Resistivity) or UHR (Ultra High Resistivity) applications. Therefore, it is important to allow this transient behavior to relax sufficiently so as to extract the true net melt dopant concentration measured by resistivity. Accurate resistivity measurement may require waiting at least 4 hours post thermal donor annihilating anneal and lapping for the resistivity to decay ~90% and up to 12 hours is needed for resistivity to decay at >95%. FIG. 12 shows the relaxation curve on a center slab after thermal donor annihilating anneal and lapping after two different treatments on the same slab. As shown in FIG. 12, it may take over 36 hours (open circle curve) for the sample slab resistivity to fully relax and stabilize. The open diamond curve in FIG. 12 depicts the resistivity stabilization time on same slab after an additional thermal donor annihilating anneal and lapping. The two curves show slightly different transient behavior in the first few hours but merge after longer time, reflective of the true and stable dopant concentration after long time relaxation at room temperature. The time required to allow for resistivity stabilization impacts the overall cycle time of the process to "sample" the polycrystalline silicon melt in order to determine the proper dopant addition for growing the desired HR or UHR full size single crystal silicon ingot, thereby impacting throughput of the process.

According to the method of the present invention, the center slab 40 sliced from the sample rod 5 is subject to irradiation to expedite the transient relaxation process to thereby lessen the stabilization duration required to obtain accurate resistivity measurements. In some embodiments, the center slab 40 is irradiated with infrared light. In some embodiments, the center slab 40 is irradiated with light having a wavelength between about 0.75 micrometers and about 1000 micrometers. In some embodiments, the center slab 40 is irradiated with light having a wavelength between about 400 nanometers and about 4.5 micrometers. In some embodiments, the center slab 40 is irradiated with light having a wavelength between about 0.75 micrometers and about 4.5 micrometers. Any commercially available lamp capable of producing irradiation within these ranges may be suitable for the method of the present invention. In some embodiments, the center slab 40 may be irradiated for a duration of at least about 10 minutes, such as between about 10 minutes and about 2 hours, such as between about 10 minutes and 1 hour. Commercially available lamps may be used to irradiate the center slab 40, provided that such lamps irradiated within the desired wavelengths according to the method of the present invention. In some embodiments, the center slab 40 is irradiated with light at an intensity sufficient to increase the temperature of the center slab 40 to a temperature of at least about 40° C., at least about 50° C., or at least about 60° C. Temperature, in these embodiments, is a proximate measurement of a sufficient photon flux to achieve more rapid resistivity relaxation. In some embodiments, the center slab 40 is irradiated at the temperature of at least about 40° C., at least about 50° C., or at least about 60° C. for at least about 10 minutes. In some embodiments, the center slab 40 is irradiated at the temperature of at least about 40° C., at least about 50° C., or at least about 60° C. for between about 10 minutes and about two hours. In some embodiments, the center slab 40 is irradiated at the temperature of at least about 40° C., at least about 50° C., or at least about 60° C. for between about 10 minutes and about one hour. In some embodiments, the center slab 40 is irradiated at the temperature of at least about 40° C., at least about 50° C., or at least about 60° C. for about 10 minutes. In some embodiments, the center slab 40 is irradiated at the temperature of at least about 40° C., at least about 50° C., or at least about 60° C. for about one hour.

Although the proper duration and intensity of irradiation may be determined by measuring the temperature, in some embodiments, the temperature increase is unlikely to be critical to the enhanced relaxation and stabilization of the resistivity of the slab. That is, a temperature increase is not required to achieve the resistivity relaxation that is the outcome of irradiation. The required photon flux may, in some embodiments, be achieved without a temperature increase. Irradiation, according to the method of the present invention, may be accompanied by heating, but it is believed that the irradiation leads to relaxation, which implies that photodissociation caused by photo flux is the dominant mechanism of enhanced relaxation. The mechanism of photodissociation may involve photogenerated carriers, which would imply that the range of light suitable for relaxation may be broad, e.g., from the visible (or even the near UV) down to about 1100 nm (corresponding to the band gap energy) in the near IR, so range would be about 250-1100 nm. It is also possible that the photodissociation could involve optical excitation of some lower energy state such as a vibrational state or a defect electronic state in the bandgap, in which case the photodissociation could extend into the mid-IR. Before resistivity measurement, the slab is cooled to below 30° C., such as room temperature, which generally takes a few minutes, such as up to 30 minutes, or 10 minutes, or between 1 and 5 minutes.

The resistivity of the melt from which the product ingot is grown may be determined by measuring the resistivity of the center slab 40. In some embodiments, the resistivity is measured after irradiation, following by cooling to below 30° C., in the event irradiation causes an increase in the temperature of the center slab 40. In some embodiments of the present disclosure, current is driven through the center slab 40 and a resistivity probe is contacted at one or more locations along the length of center slab 40. Current may be applied to the rod 5 through one of the ends 54, 56.

In some embodiments, the resistivity of the center slab 40 is measured by a four-point resistivity probe (e.g., an in-line four-point probe) in which all four probe tips contact the slab 40. The slab 40 may be mounted in a jig during resistivity measurement. In accordance with some embodiments, a current (e.g., direct current) is passed through the slab 40 between the outer probe pins and the resulting potential difference is measured between the inner probe pins. The resistivity is calculated from the measured current and potential values based on the factors appropriate from the slab geometry. In this regard, the resistivity may be measured in accordance with SEMI MF84-0307 entitled "Test Method for Measuring Resistivity of Silicon Wafers with an In-line Four-Point Probe" and/or SEMI MF43-0705 entitled "Test Methods for Resistivity of Semiconductor Materials", which are incorporated herein by reference for all relevant and consistent purposes. The voltage may be measured at various points along the length of the slab 40. The measured voltages and the sample length and average thickness may be used to calculate the resistivity such as by determining the slope of a current-voltage curve (e.g., Example 1 below).

In some embodiments, the sample rod 5 and center slab 40 have a relatively low oxygen content such as an oxygen content of less than about 5.5 ppma. In other embodiments, the oxygen content of the sample rod 5 and slab 40 is less than 5.2 ppma, less than 5.0 ppma, less than 3.5 ppma, less than about 3 ppma or even less than about 2.5 ppma. In some embodiments, the sample rod 5 and slab 40 produced from the sample rod 5 is free of dislocations.

The measured resistivity of the slab 40 provides information related to the resistivity of the polycrystalline silicon melt in the crucible (i.e., the starting dopant impurity concentration (i.e., net donor-acceptor concentration)). The measured resistivity of the slab 40 may be used to adjust the manufacturing conditions for the subsequently grown ingot. For example, an amount of dopant may be added to the polycrystalline silicon melt with the amount of dopant being adjusted based at least in part on the measured resistivity (e.g., by use of a model that predicts product ingot resistivity). Suitable dopants include p-type dopants such as boron, aluminum, gallium and indium and n-type dopants such as phosphorous, arsenic and antimony.

The resistivity measured provides an indirect measure of the total p-type dopant, e.g., boron, or n-type dopant, e.g., phosphorus, in the incoming polycrystalline silicon. Depending on the resistivity and type measured, minute amounts of p-type dopant, e.g., boron, or n-type dopant, e.g., phosphorus, are added to achieve the proper seed end resistivity target for Ultra High Resistivity (>5K ohm cm and more specifically >7.5K ohm cm) material. The precision to target is greatly impacted by the accuracy of the short body or fat neck resistivity result. In operation, the puller remains hot waiting for the resistivity of the short body or fat neck to be determined. This adds cycle time to the overall process and can have detrimental impact on oxygen or other impurities because the crucible is continuously dissolving. A fat neck sample rod may be slabbed to remove the cycle time to grow the "sample" material. A further reduction in the cycle time of the overall process by reducing the amount of wait time needed for the resistivity to relax to near saturation from 6-12 hours down to 1 hour or less by irradiating the center slab sample. The method also provides an improvement on this accuracy for Seed End Targeting of the long UHR rod by ensuring that the resistivity measured on the short body or fat neck is fully relaxed to its final resistivity state and not to ~95% or less.

In some embodiments, an amount of dopant is added to the melt before growing the sample rod and measuring the resistivity of the rod and an amount of dopant (e.g., the same dopant or a different dopant) is added after the sample rod is grown. In other embodiments, all dopants (if any) are added after the sample rod is grown and the resistivity is measured (e.g., boron or phosphorous).

The polycrystalline silicon to which the dopant is added and from which a sample ingot and product ingot is pulled may be semiconductor grade polycrystalline silicon. When semiconductor grade polycrystalline silicon is used, in some embodiments the polycrystalline silicon has a resistivity greater than 4,000 Ω-cm and contains no more than 0.02 ppba boron or phosphorous.

After the sample rod is pulled and, optionally, dopant is added to the melt, a product ingot is withdrawn from the melt. The product ingot has a diameter greater than the diameter of the sample rod (i.e., the diameter of the constant diameter portion of the sample rod is less than the diameter of the constant diameter portion of the ingot). The product ingot may have a diameter of about 150 mm or, as in other embodiments, about 200 mm, about 300 mm or more (e.g., 450 mm or more).

In some embodiments, polycrystalline silicon is not added during the growth of the ingot (e.g., as in a batch process). In other embodiments, polycrystalline silicon is added to the melt as the product ingot is grown (e.g., as in a continuous Czochralski method).

The amount of dopant added to the melt (with or without addition of a first dopant before the sample rod is grown) may be controlled to achieve a target resistivity in at least a portion of the main body of the ingot (e.g., a prime portion of the ingot). In some embodiments, the target resistivity is a minimum resistivity. In some embodiments, the entire length of the ingot (e.g., length of the body of the ingot) has the target resistivity (e.g., minimum resistivity). In some embodiments, the target resistivity of at least a portion of the product ingot is a minimum resistivity of at least about 500 Ω-cm, at least about 1,000 Ω-cm, at least about 1,500 Ω-cm, at least about 2,000 Ω-cm, at least about 4,000 Ω-cm, at least about 6,000 Ω-cm, at least about 8,000 Ω-cm, or at least about 10,000 Ω-cm, or from about 500 Ω-cm to about 50,000 ohm-cm, from about 1,000 Ω-cm to about 50,000 ohm-cm, from about 1,500 Ω-cm to about 50,000 ohm-cm, or from about 8,000 Ω-cm to about 50,000 Ω-cm. Alternatively or in addition, the sample rod (and the resulting center slab) may have a resistivity of at least about 500 Ω-cm, at least about 1,000 Ω-cm, at least about 1,500 Ω-cm, at least about 2,000 Ω-cm, at least about 4,000 Ω-cm, at least about 6,000 Ω-cm, at least about 8,000 Ω-cm, or at least about 10,000 Ω-cm, or from about 500 Ω-cm to about 50,000 ohm-cm, from about 1,000 Ω-cm to about 50,000 ohm-cm, from about 1,500 Ω-cm to about 50,000 ohm-cm, or from about 8,000 Ω-cm to about 50,000 Ω-cm.

In some embodiments, a p-type single crystal silicon ingot is targeted. If the resistivity of the sample slab is below target, the added dopant is selected from the group consisting of phosphorus, arsenic, and antimony and wherein the dopant is added to increase the resistivity of the p-type single crystal silicon ingot.

In some embodiments, a p-type single crystal silicon ingot is targeted. If the resistivity of the sample slab is above target or if the resistivity measurement indicates that the slab is n-type, the added dopant is selected from the group consisting of boron, gallium, and aluminum and wherein the dopant is added to decrease the resistivity of the p-type single crystal silicon ingot.

In some embodiments, an n-type single crystal silicon ingot is targeted. If the resistivity of the sample slab is below target, the added dopant is selected from the group consisting of boron, gallium, and aluminum and wherein the dopant is added to increase the resistivity of the n-type single crystal silicon ingot.

In some embodiments, an n-type single crystal silicon ingot is targeted. If the resistivity of the sample slab is above target or if the resistivity measurement indicates that the slab is p-type, and the added dopant is selected from the group consisting of phosphorus, arsenic, and antimony and wherein the dopant is added to decrease the resistivity of the n-type single crystal silicon ingot.

Compared to conventional methods for producing a single crystal silicon ingot, the methods of the present disclosure have several advantages. Relatively high purity polycrystalline silicon that is used to produce relatively high resistivity single crystal silicon has a wide spread in boron and phosphorous impurity amounts which causes a wide spread in the intrinsic resistivity. By growing a sample rod with relatively small diameter (e.g., less than the product ingot such as less than 100 mm, less than 50 mm, less than 25 mm or even less than 10 mm compared to sample ingots that have a size substantially the same of the product ingot such as at least 200 mm) and forming a slab from the sample rod, the resistivity of the melt can be sampled relatively quickly and reliably.

The measured resistivity may be used for more precise addition of dopant to achieve better targeting of high resistivity or ultra-high resistivity products (e.g., at least about 3000 ohm-cm, 5000 ohm-cm or at least 7000 ohm-cm or more) and, in particular, for better seed-end resistivity targeting. The relatively small diameter sample rod consumes relatively little amount of the melt (e.g., less than 1 kg, less than 0.5 kg or about 0.25 kg or less compared to a full diameter short ingot which may consume 15 kg, 20 kg or 50 kg or more of the melt) and reduces impurity build-up attributed to the sampling process. The sample rod may be grown relatively quickly (e.g., about 12, 10 or even 5 hours or less compared to a full size short ingot which may involve 20 hours, 30 hours, 40 hours, or 50 hours of growth time). The slab cropped from the sample rod may have a relatively low oxygen content (e.g., such as less than about 5 ppma or less than 4 ppma) which may improve the accuracy of the resistivity measurement (e.g., the accuracy after a thermal donor kill cycle).

Variability in the measurement of resistivity from the sample rod may be caused by (1) diameter correction for resistivity as measured by a two-point probe, contact noise due to preparation of a planar segment on the sample rod, and/or (3) large surface morphology variation. By forming a slab from the sample rod, the resistivity may be measured relatively near the axisymmetric center of the sample rod. This improves the accuracy of the resistivity measurement as radial variation in resistivity is reduced or eliminated. In embodiments in which the slab is lapped to reduce morphology caused by grinding and to improve thickness uniformity, the resistivity measurement may be more accurate. In embodiments in which a four-point probe is used to measure resistivity, the resistivity measurement may be further improved.

Reduced sample rod growth time and reduced resistivity measurement times reduce the processing time at which the resistivity measurement is provided (e.g., 20, 30 or 40 hours in reduction of process time) which reduces impurity buildup caused by crucible dissolution. Reducing impurities also improves resistivity predictability for future runs. Reduction in the hot hour time for each batch (i.e., between product ingots) allows for the crucible to recharged in additional cycles without an increase in loss of zero dislocation.

EXAMPLES

The processes of the present disclosure are further illustrated by the following Examples. These Examples should not be viewed in a limiting sense.

Example 1: Determination of Resistivity from I-V Curve

Figure 5:
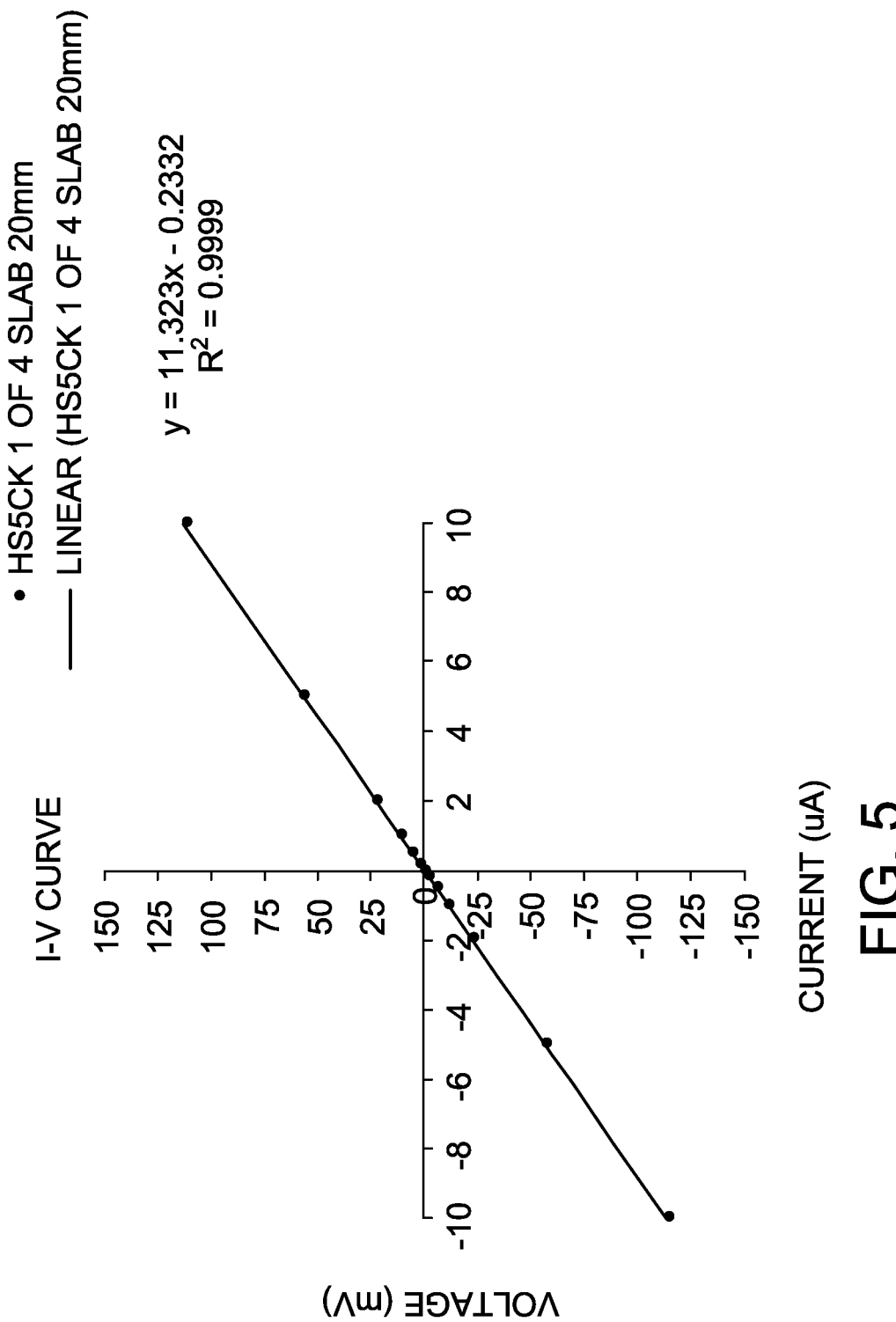
FIG. 5 is an I-V curve used to measure resistivity.

Voltage of a sample rod was measured axially with the applied current and measured voltage being recorded. FIG. 5 shows the I-V curve that was generated. Using the geometry of the sample and the slope of the I-V curve, the resistivity was determined to be 6139 ohm-cm for the sample. Resistivity may be similarly determined for a center slab cropped from the sample rod.

Example 2: Comparison of Short Ingot Vs Sample Rod

A single crystal short sample ingot ("Short Ingot") having a diameter of about the size of the product ingot (e.g., about 200 mm in a 200 mm pulling apparatus) was grown in a pulling apparatus similar to FIG. 1. The crystal was cropped and subjected to a mixed acid etch (MAE). The crystal slug was rapid thermal annealed at 800° C. for 3 minutes and lapped. The slug was contacted with a four-point probe to measure the resistivity with the resistivity being averaged over three measurements.

A sample rod ("Sample Rod") was grown in locked seed lift mode in the same pulling apparatus after the short ingot was grown. The diameter of the rod varied across its length and was within a range of 17-23 mm with an average of 20 mm. The sample rod was cropped and ground to form a flat segment that extended from one end to the other end of the rod. The rod was rapid thermal annealed at 720° C. for 2 minutes. The resistivity of the ingot was measured with a two-point probe. The differences between the growth conditions are shown in Table 1 below:

TABLE 1

Growth Conditions for Sample Ingot 200 mm in Diameter and a Sample Rod ~17-23 mm in Diameter

|  | Short Ingot | Sample Rod |
| --- | --- | --- |
| Diameter (mm) | 207 | ~17-23 |
| Weight (kg) | 31 | 0.11 |
| Length (mm) | 250 | 200 |
| Process Time (hr) | 25 | 5 |
| Resistivity Sample Preparation Time (hr) | 26 | 6 |
| Total time (hr) | 51 | 11 |

Figure 6:
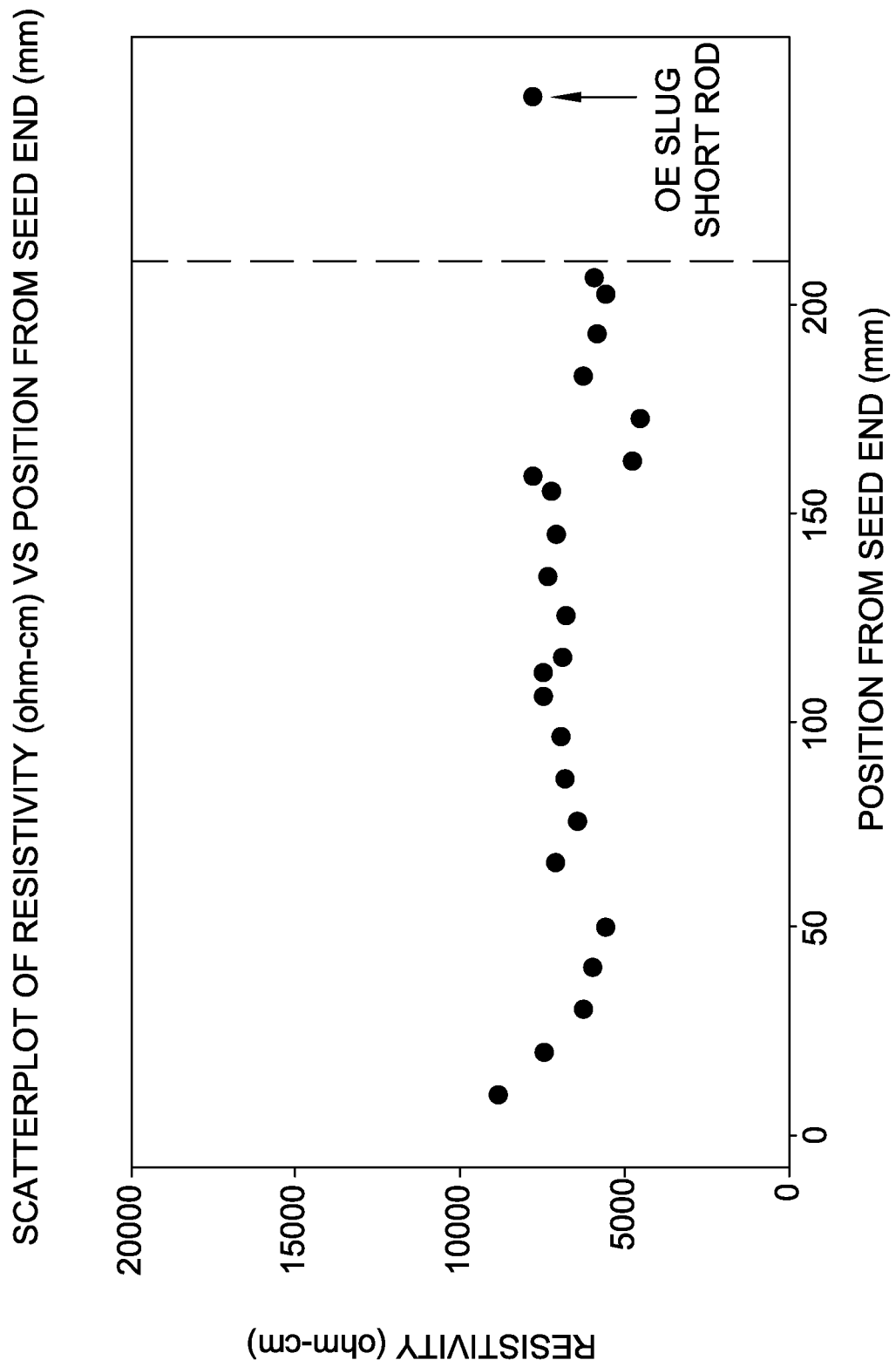
FIG. 6 is a scatter plot of the resistivity of a sample rod at various positions from the seed end.

The measured resistivities across the length of the sample rod and the resistivity of a slug from the sample ingot are shown in FIG. 6.

The sample preparation time for the short ingot was 26 hours and involved cropping, mixed-acid etch, rapid thermal anneal, slab cutting, grinding (e.g., with a diamond pad), lapping and resistivity measurement. The sample preparation time for the sample rod was 6 hours and involved cropping, mixed-acid etch, rapid thermal anneal, flat grinding (with a diamond grinder), lapping and resistivity measurement. The sample rod process time was 20% of the short ingot process time (5 hours vs 25 hours) and the total time of the sample rod was 22% of the total time of the short ingot total time (11 hours vs 51 hours). In some embodiments, sample rod process time and total time ranges from about 15% to about 25% of the short ingot process time and total time.

Example 3: Comparison of Sample Rod Resistivity, Short Ingot Resistivity and Product Ingot Seed-End Resistivity A single crystal short sample ingot ("Short Ingot") and two sample rods ("Sample Rod") were grown under the conditions of Example 2. One sample rod was grown before the short ingot was grown and one sample rod was grown after the short ingot was grown. A product ingot was also grown with a target seed-end resistivity of about 8,000 ohm-cm (p-type). Because the short ingot had a resistivity of about 5,000 ohm-cm, an amount of phosphorous dopant was added to target a resistivity of at least 7,500 ohm-cm in the product ingot.

Figure 7:
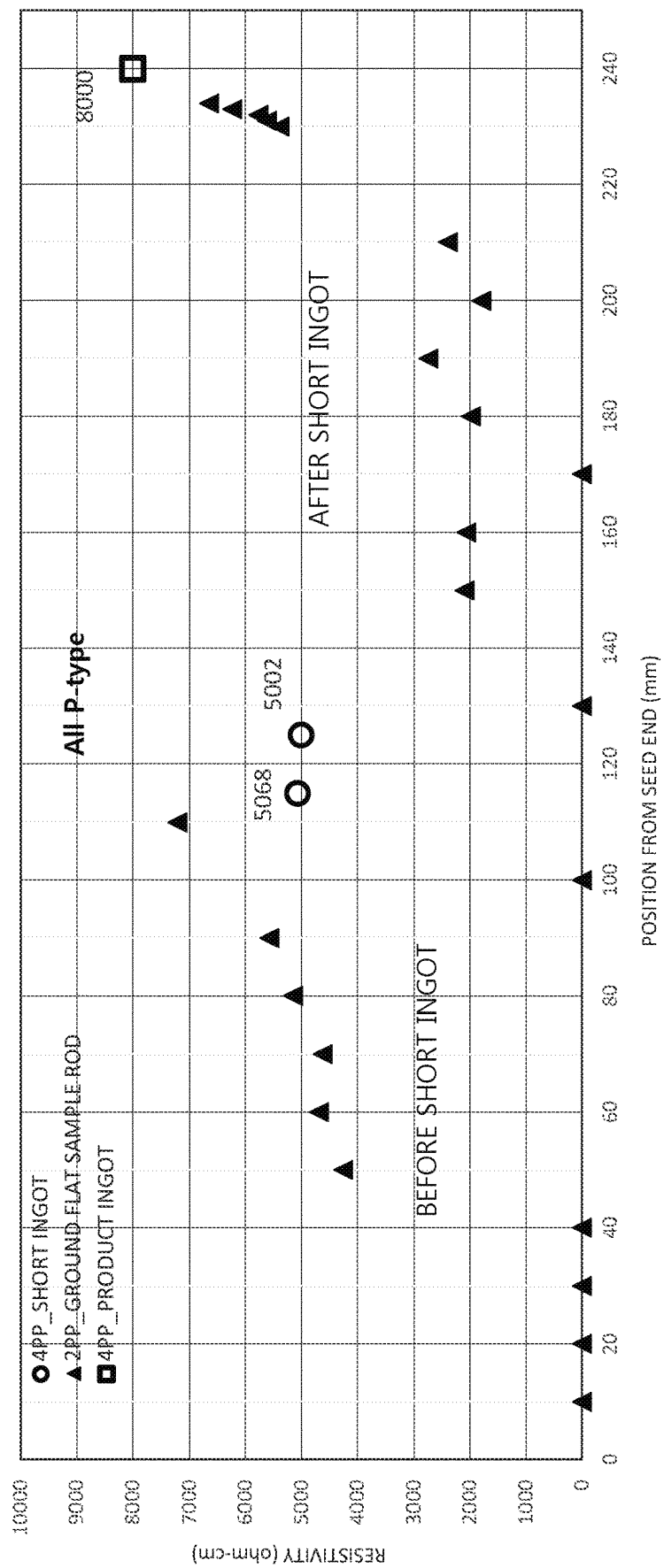
FIG. 7 is a scatter plot of the resistivities of a sample rod ground flat and of a short ingot and product ingot.

The resistivity of the sample rod was measured by a two-point probe and the resistivities of the slugs of the short ingot were measured by a four-point probe with the results being shown in FIG. 7. The resistivity of the product ingot near the seed-end is also shown in FIG. 7. Variation in the two-point measurement of the sample rod may be observed from FIG. 7. The variation in the resistivity measurement in the sample rod grown before the short ingot would cause over doping (e.g., if an average had been used). Similar variation (not shown) was observed when the sample rod was cut in half (center cut).

Figure 8B:
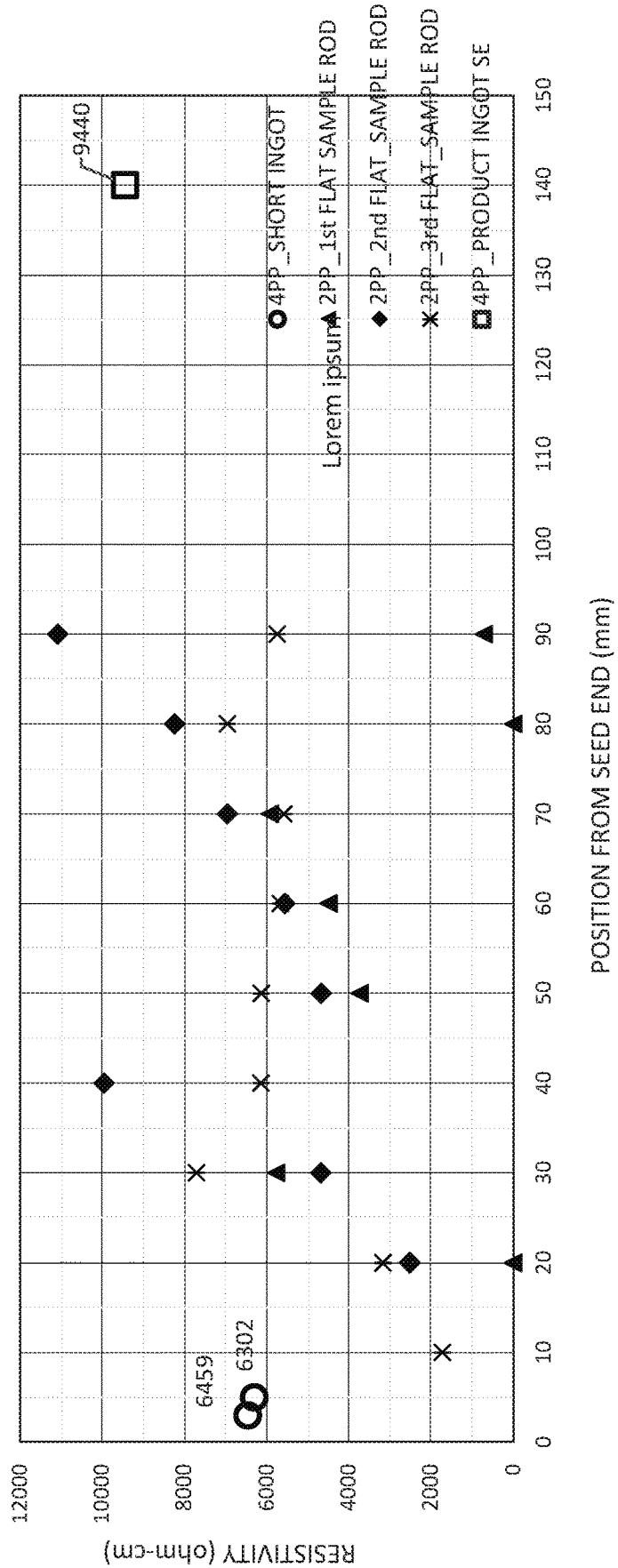
FIG. 8B is a scatter plot of the resistivities of the successively ground sample rods of FIG. 8A and of a short ingot and product ingot.

Example 4: Variability in Resistivity Measurement Verse Proximity to Axisymmetric Center of Sample Rod A single crystal short sample ingot ("Short Ingot") and a sample rod ("Sample Rod") were grown under the conditions of Example 2. A product ingot was also grown with a target seed-end resistivity of about 7,500 ohm-cm (p-type). The sample rod was ground three times to form planar segments on the sample rod that were progressively closer to the central axis of the sample rod (FIG. 8A). The resistivity along the rod was measured by a two-point probe after each planar segment was formed with the resistivities of each flat being shown in FIG. 8B. The short ingot resistivity that was used to determine the dopant amount for the product ingot and the product rod resistivity are also shown in FIG. 8B.

As shown in FIG. 8B, the axial measurements for each flat become flatter and less axially variable with each removal. For each flat, the initial seed resistivity of the sample rod is well below the mid to late body average of the rod. Each flat average would have been below the short ingot average which would cause additional phosphorus dopant to be used which would drive the product ingot away from the 7,500 ohm-cm target.

Example 5: Comparison of Resistivity Measurements of Center Cut Sample Rod Verse Center Slab Sample rods were grown under the conditions of Example 2 just prior to growth of a short ingot. One sample rod was center cut and one sample rod was processed to form a center slab about 1.1 mm thick. Sample rods were grown under the conditions of Example 2 just after the short ingot was grown with one sample rod being center cut and the other sample rod being processed to form a center slab about 1.1 mm thick. To prepare the center cut sample rods, after the thermal donor kill anneal and a four hour wait time, the sample rod top and tail were removed and the rods were cut axially down the center line to make two half pieces. To prepare the center slabs, the sample rod top and tail were removed and the rods were cropped to form the center slab. After a mixed-acid etch (MAE), the center slab was subjected to a thermal donor kill anneal. Resistivity was measured after a four hour wait time. The resistivity of the center cut sample rods were measured with a two-point probe and the resistivity of the center slabs were measured with a four-point probe. A product ingot was also grown and the seed-end resistivity was measured. The resistivity measurements are shown in FIG. 9.

Figure 9:
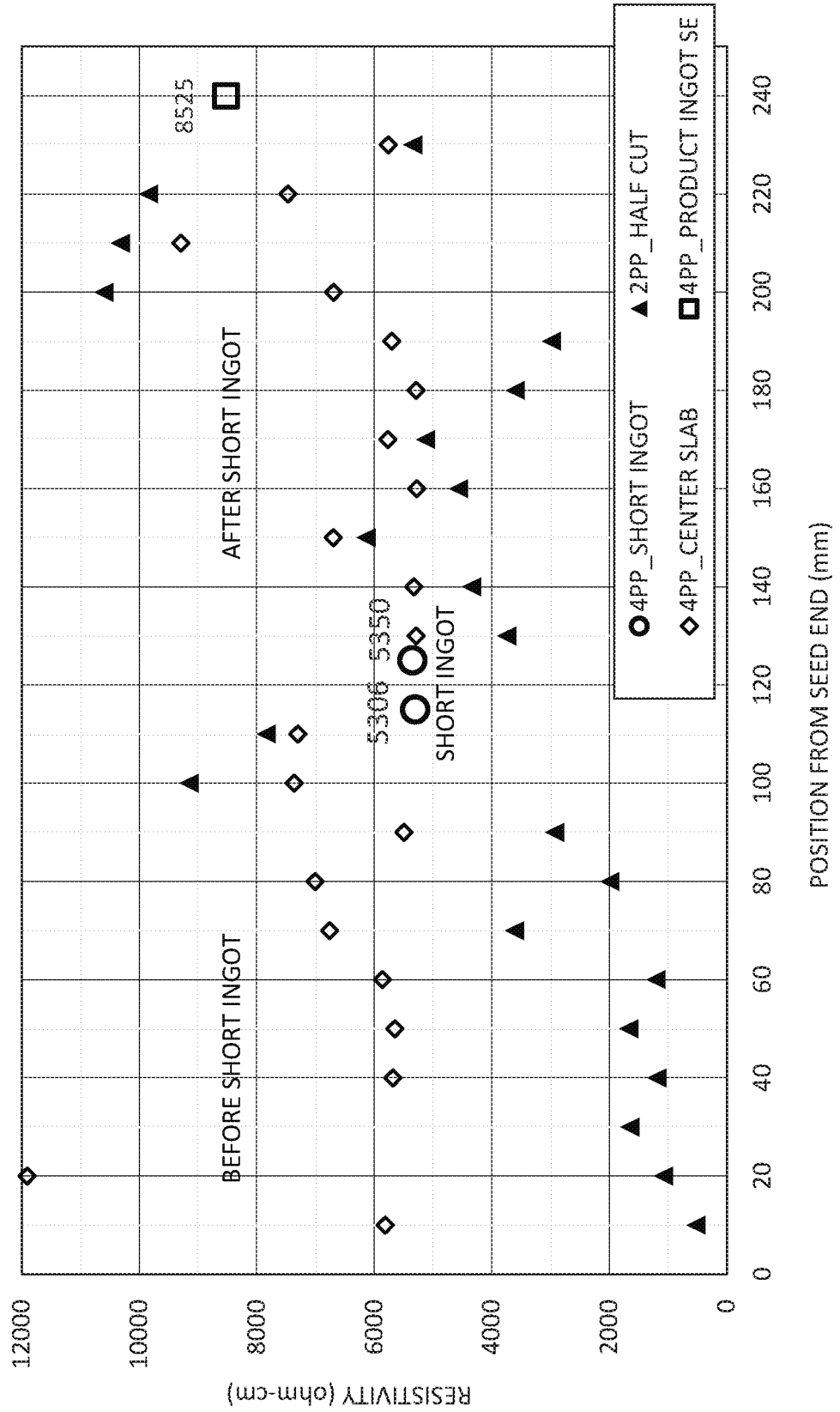
FIG. 9 is a scatter plot of the resistivities of half cut sample rods and center slabs cropped from a sample rod and of a short ingot and a product ingot.

As shown in FIG. 9, axial variation is observed in the center cut sample rods. The center slab measurements included some random variation in axial measurements but with the average resistivity being relatively close to the short body (~6200 ohm-cm). Resultant dopant addition would be similar if center slab resistivity was used to determine dopant addition (e.g., very small addition of phosphorous).

Example 6: Comparison of Resistivity of Sequential Flat Grinds of a Sample Rod Verse Center Slab A sample rod was grown according to Example 2. The sample rod was sequentially ground with resistivity being measured with a two-point probe after each grind as in Example 4. A sample rod was also grown and processed to form a center slab about 1.1 mm thick. The resistivity of the center slab was measured by a four-point probe. A short ingot and product ingot were also grown after the sample rods were formed with the seed-end resistivity being measured from slugs. The resistivities are shown in FIG. 10.

Figure 10:
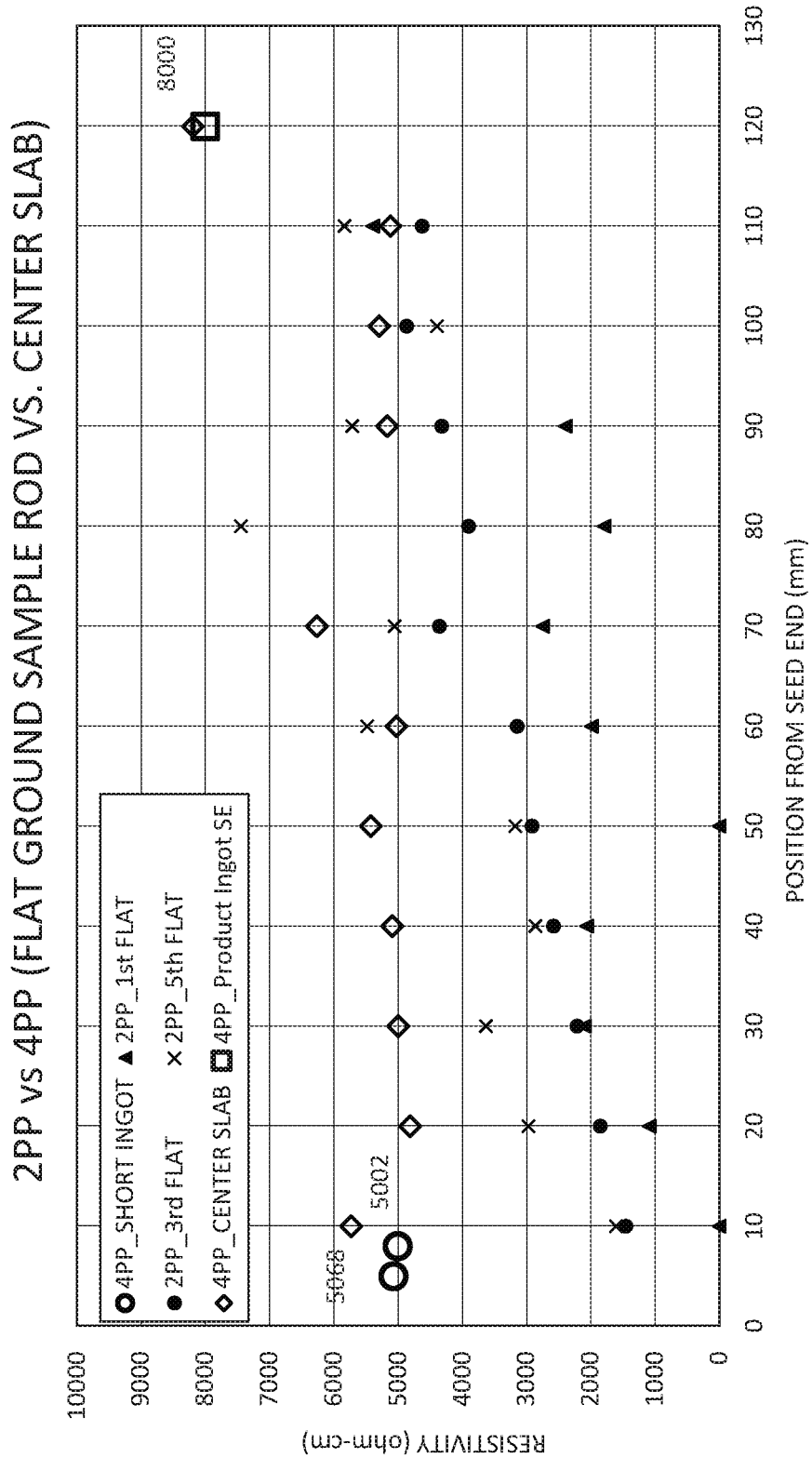
FIG. 10 is a scatter plot of the resistivities of a successively ground sample rod and a center slab cropped from a sample rod and of a short ingot and a product ingot.

As shown in FIG. 10, each flat measurement ($1^{st}$, $3^{rd}$ and $5^{th}$ grinds being shown) included an axial trend from seed end to the opposite end with the overall average resistivity being below that of the short ingot. The center slab measurement shows a flatter axial trend with the overall average being very similar to the short body resistivity, resulting in a similar dopant addition.

Example 7: Accuracy of the Resistivity Prediction

Table 2 shows the resistivity of a short ingot compared to the resistivity of a center slab cropped from a sample rod as measured by a four-point probe ("4PP") and the resistivity of a sample rod with a planar segment ground into the sample rod as measured by a two-point probe ("2PP"). The short ingot was grown before the sample rods. The short ingot resistivity was measured at the opposite end of the short ingot (~250 mm). The sample rod data points are the average of the axial resistivity from the seed end to the opposite end taken every 10 mm. A product ingot was grown with the resistivity at the seed end (~150 mm body position) being shown in Table 2. The sample rods, short ingots and product ingots were grown in eight runs in accordance with the conditions of Example 2.

TABLE 2

Sample Rod, Short Ingot, and Product Ingot Resistivity Measurements

| Short Ingot | Sample Rod + 2PP Avg. Excluding Min & Max | Sample Rod Center Slab + 4PP Exclude > +/−30% | Product Ingot | Rank Ingot | Rank Sample Rod + 2PP | Rank Center Slab + 4PP |
|---|---|---|---|---|---|---|
| 5002  | 3513  | 5290 | 8000  | 1 | 0   | 1 |
| 5306  | 2573  | 5932 | 8525  | 1 | 0   | 1 |
| 5350  | 5890  | 5411 | 8525  | 1 | 0.5 | 1 |
| 6302  | 6673  | 7737 | 9440  | 1 | 0.5 | 1 |
| 13320 | —     | 7833 | 6531  | 0 | —   | 1 |
| 8884  | 12262 | 9470 | 11000 | 1 | 0   | 1 |
| 9514  | 5047  | 7572 | 8160  | 1 | 0   | 1 |
| 9514  | 15180 | 8444 | 8160  | 1 | 0   | 1 |

As shown in Table 2, the short ingot resistivity and the sample rod center slab (4PP) resistivity are relatively similar and dopant addition by either result would have been directionally similar. The sample rod with the planar segment (2PP) included several results that are directionally opposite to the short body which would have caused a wrong dopant (i.e., P-type vs. N-type) to be added. This indicates that the sample rod center slab with four-point probe resistivity measurement predicts the resistivity of the product ingot with better accuracy.

Figure 11:
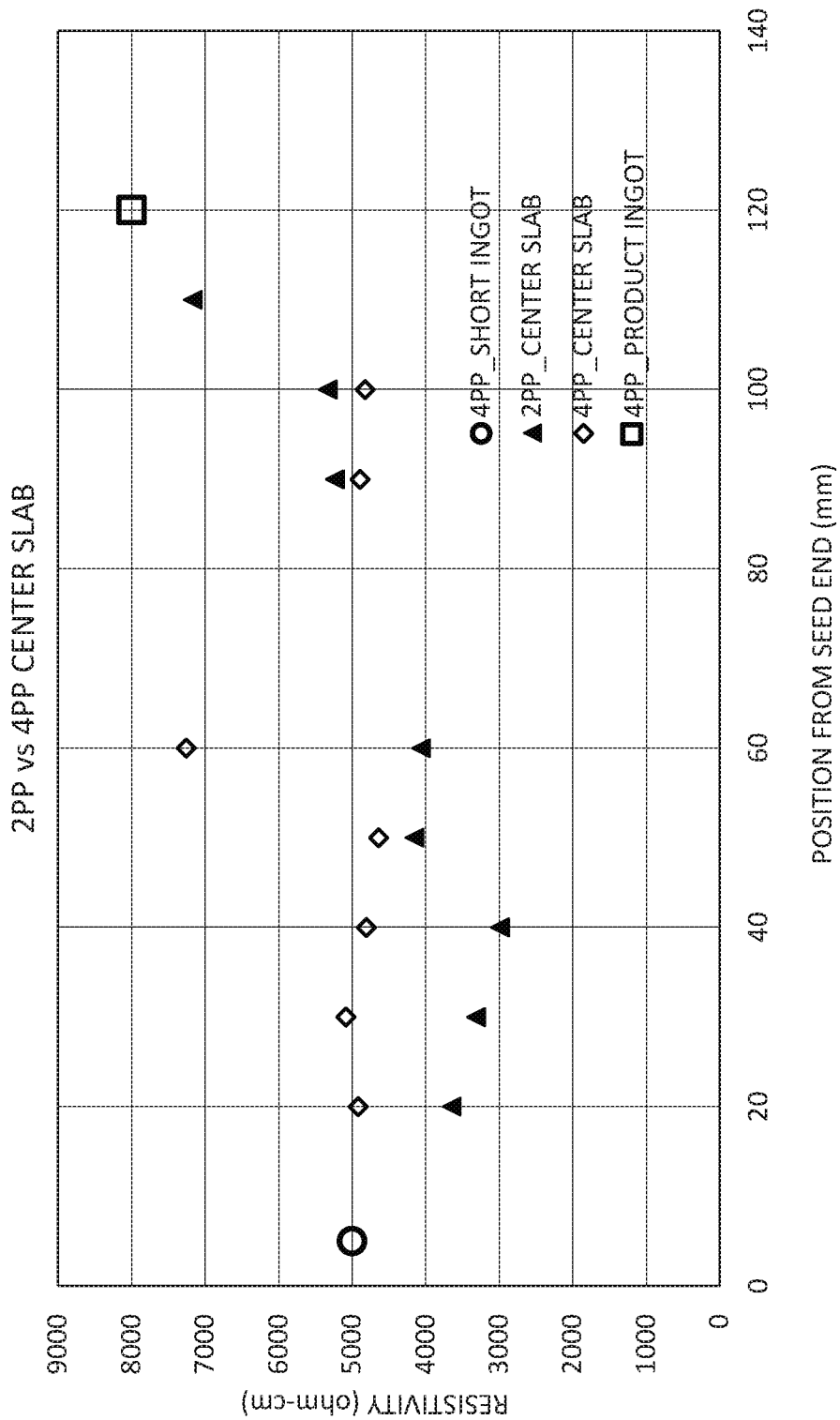
FIG. 11 is a scatter plot of the resistivities of a center slab cropped from a product ingot as measured by a two-point probe and as measured by a four-point probe and of a short ingot and product ingot.

Example 8: Comparison of Two-Point Probe Resistivity Measurement and Four-Point Probe Resistivity Measurement on Center Slab The resistivity of several center slabs cut from sample rods were measured with a two-point probe and were measured with a four-point probe. The short ingot resistivity (4PP) was also measured. As shown in FIG. 11, the two-point measurement and four-point measurement track relatively closely with the average axial resistivity being similar to the short ingot. This indicates that the axial variation in measurement between short sample rods with a planar segment and center slabs is caused by the physical volume of the sample and the amount of thickness variation compensation that is used.

Example 9. Slab Irradiation to Enhance Resistivity Relaxation

A sample rod was grown and a center slab was cut from the sample rod. The center slab was subjected to a thermal donor annihilation anneal at 720° C. for 2 minutes. Thereafter, the center slab was lapped in a carrier under 10 kg weight pressure.

The annealed and lapped slabbed was irradiated using an infrared (IR) lamp. The IR lamp heated the sample fat neck slab to about 50° C. for longer than 10 minutes. Although irradiation and photo flux were measured using a temperature measurement, it is currently thought that heating is not the dominant relaxation mechanism. Irradiation is accompanied by heating, but it is currently thought that photodissociation is the dominant mechanism. Changing the lamp-to-sample distance changed both the temperature of the slab and the photon flux on the sample, which changed the photodissociation rate. Since both mechanisms result from irradiation, it may not be possible to separate the respective effects on resistivity relaxation. However, it is currently believed that photodissociation may likely proceed at any temperature.

Figure 13:
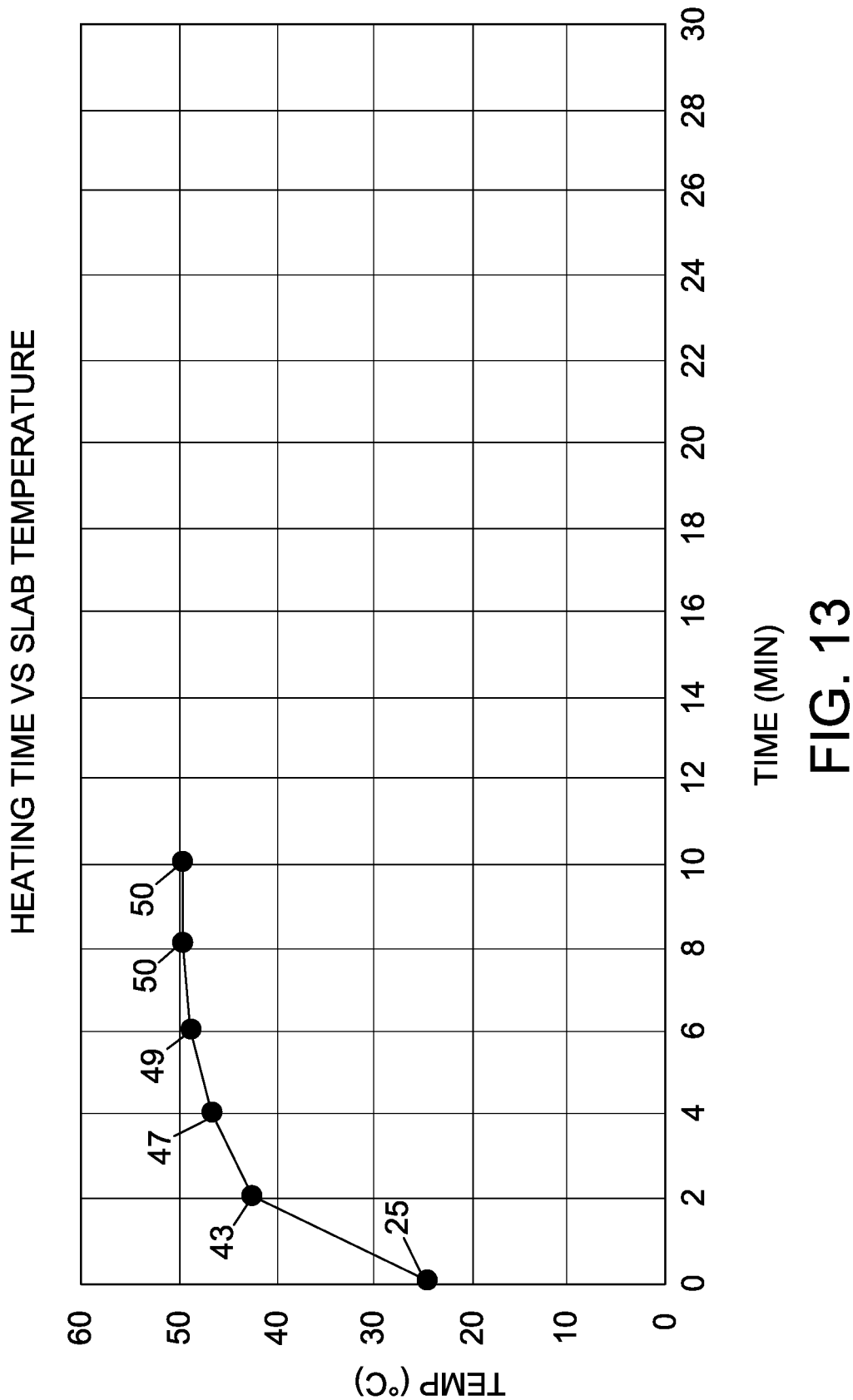

The sample was allowed to cool back to room temperature by waiting about 2 minutes and then resistivity is measured by 4 point probe at room temperature. It has been found that it takes approximately 10 minutes of irradiation for the fat neck to come to equilibrium temperature using IR lamp setup. See FIG. 13, which is a graph depicting the temperature profile of the fat neck center slab during irradiation. Time zero is when the IR lamp is turned on. The increase in temperature is monitored to reach a desired endpoint of about 50° C., but this temperature monitoring is to approximate a sufficient photon flux to effect sufficient photodissociation. The fat neck center slab was held at 50° C. for longer than 10 minutes to achieve the desired relaxation transient of resistivity within 2 hours. The sample can be held at longer times at the soak temperature but 10 minutes is the minimum time requirement.

Example 10. Slab Irradiation to Enhance Resistivity Relaxation

Sample rods were grown with a target resistivity of 1500 ohm-cm, and center slabs were cut from the sample rods. Two center slabs were subjected to thermal donor annihilation anneal at 720° C. for 2 minutes. Thereafter, the center slabs were lapped in a carrier under 10 kg weight pressure.

Figure 14A:
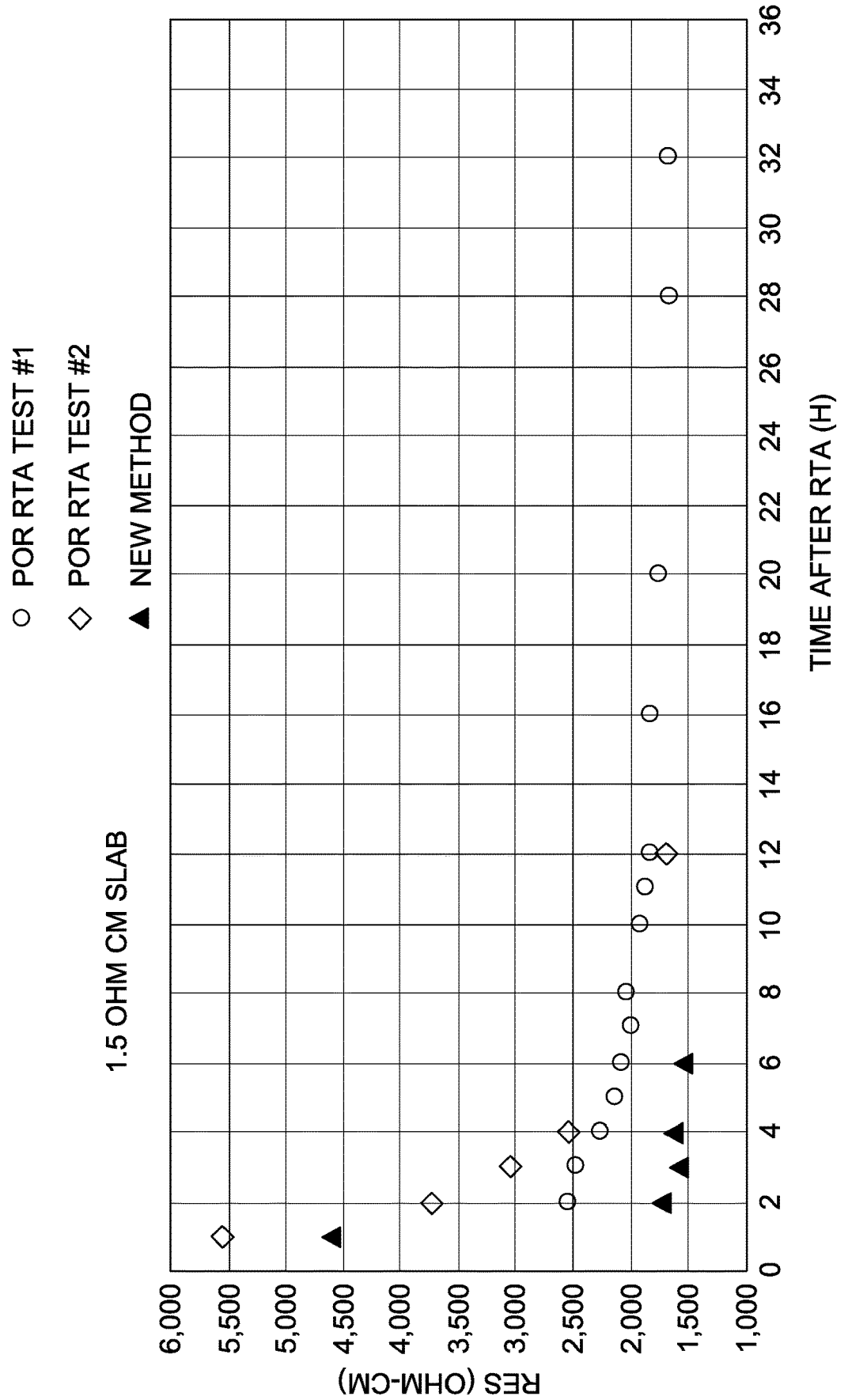
FIG. 14A is a graph comparing resistivity relaxation on a fat neck center slab ~1.5K ohm cm with IR irradiation (New Method) and without (POR Test #1 and #2). IR irradiation anneal was started 1 hr after thermal donor annihilation anneal.
Figure 14B:
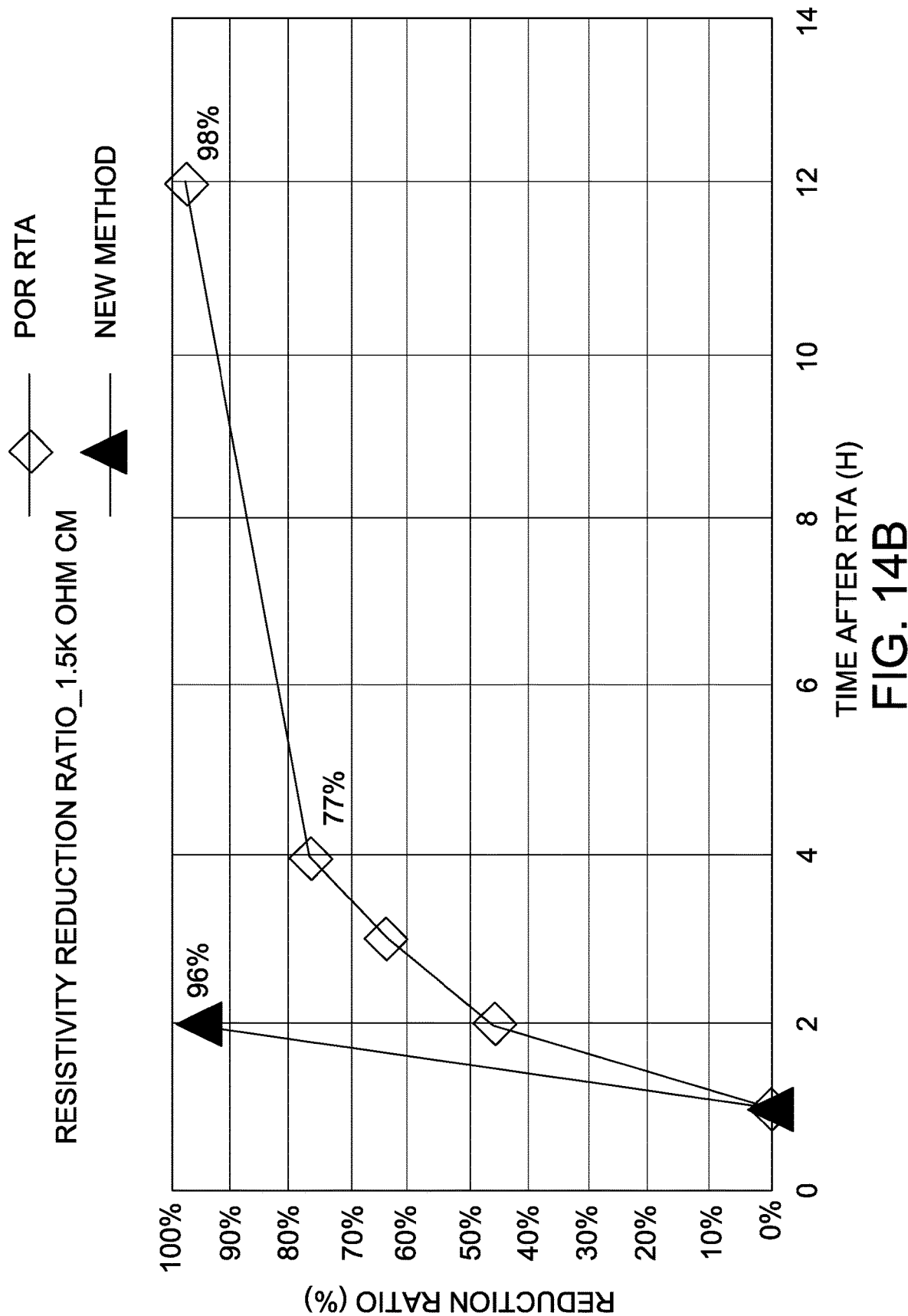
FIG. 14B is a graph depicting the relative resistivity reduction vs. time for the center slabs with IR irradiation (New Method) and without (POR test #2) for 1.5K center slabs.

One center slab was allowed to relax and stabilize resistivity for 32 hours. A second center slab was irradiated in infrared light to a temperature at least 50° C. for 60 minutes. FIG. 14A is a graph comparing resistivity relaxation on a fat neck center slab ~1.5K ohm cm with IR irradiation (New Method) and without (POR Test #1 and #2). IR irradiation anneal was started 1 hr after thermal donor annihilation anneal. As shown by the open circles, about 32 hours relaxation was needed for the non-irradiated sample to reach near full saturation and resistivity stabilization. The open diamonds on the same sample re-prepared show a slightly different initial transient decay (presumable due to the RTA and/or lap treatment at the time) but after 12 hours the curves converge to similar resistivity values. The black triangles are the decay curve observed using the new method which included IR irradiation after lapping. The graph clearly shows that the low temperature anneal expedited the relaxation such that the resistivity came to full saturation only 1 hour after the anneal. FIG. 14B is a graph depicting the relative resistivity reduction vs. time for the fat neck center slabs with IR irradiation (New Method) and without (POR test #2) for 1.5K fat neck slabs. The results clearly show that a 1 hour low temperature anneal is more than sufficient to relax the resistivity to near 100% saturation, whereas on the POR process, a 12 hour wait post RTA/lap can achieve ~95% of the final resistivity.

Example 11. Slab Irradiation to Enhance Resistivity Relaxation

Figure 15A:
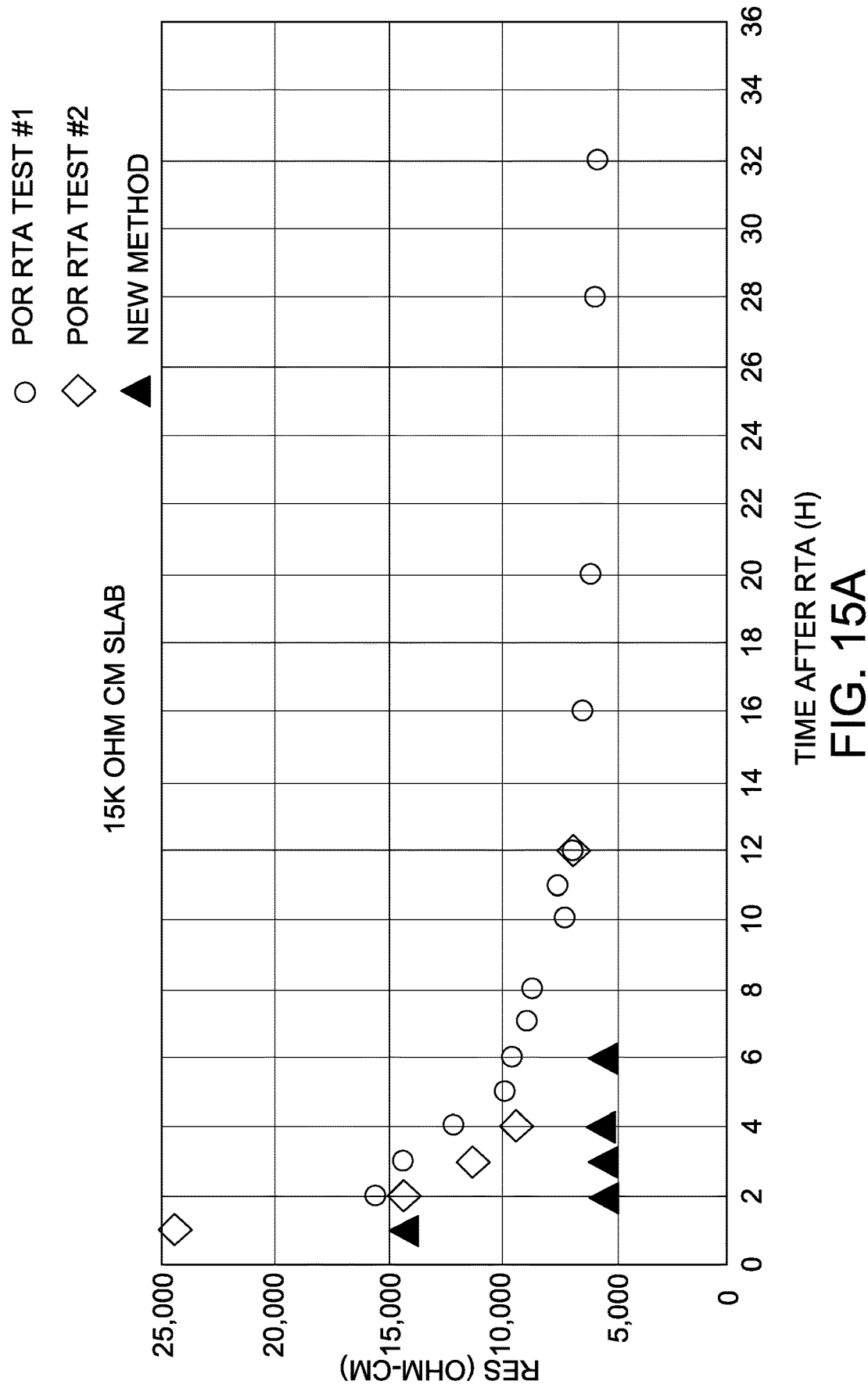
FIG. 15A is a graph comparing resistivity relaxation on a fat neck center slab ~5K ohm cm with IR irradiation (New method) and without (POR Test #1 and #2). IR irradiation anneal was started 1 hr after thermal donor annihilation anneal.
Figure 15B:
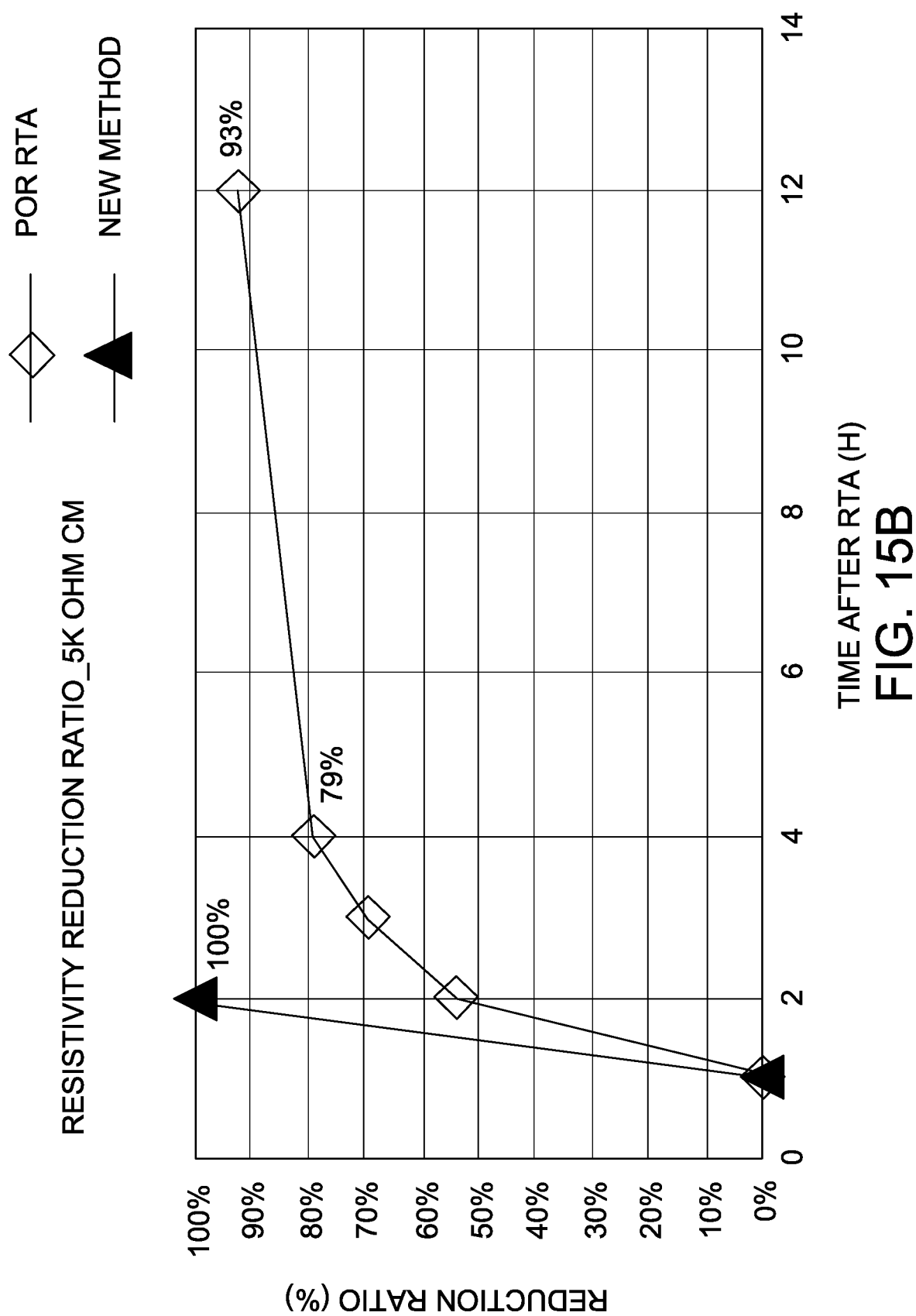
FIG. 15B is a graph depicting the relative resistivity reduction vs. time for the center slabs with IR irradiation (New Method) and without (POR test #2) for 5K center slabs.
Figure 16A:
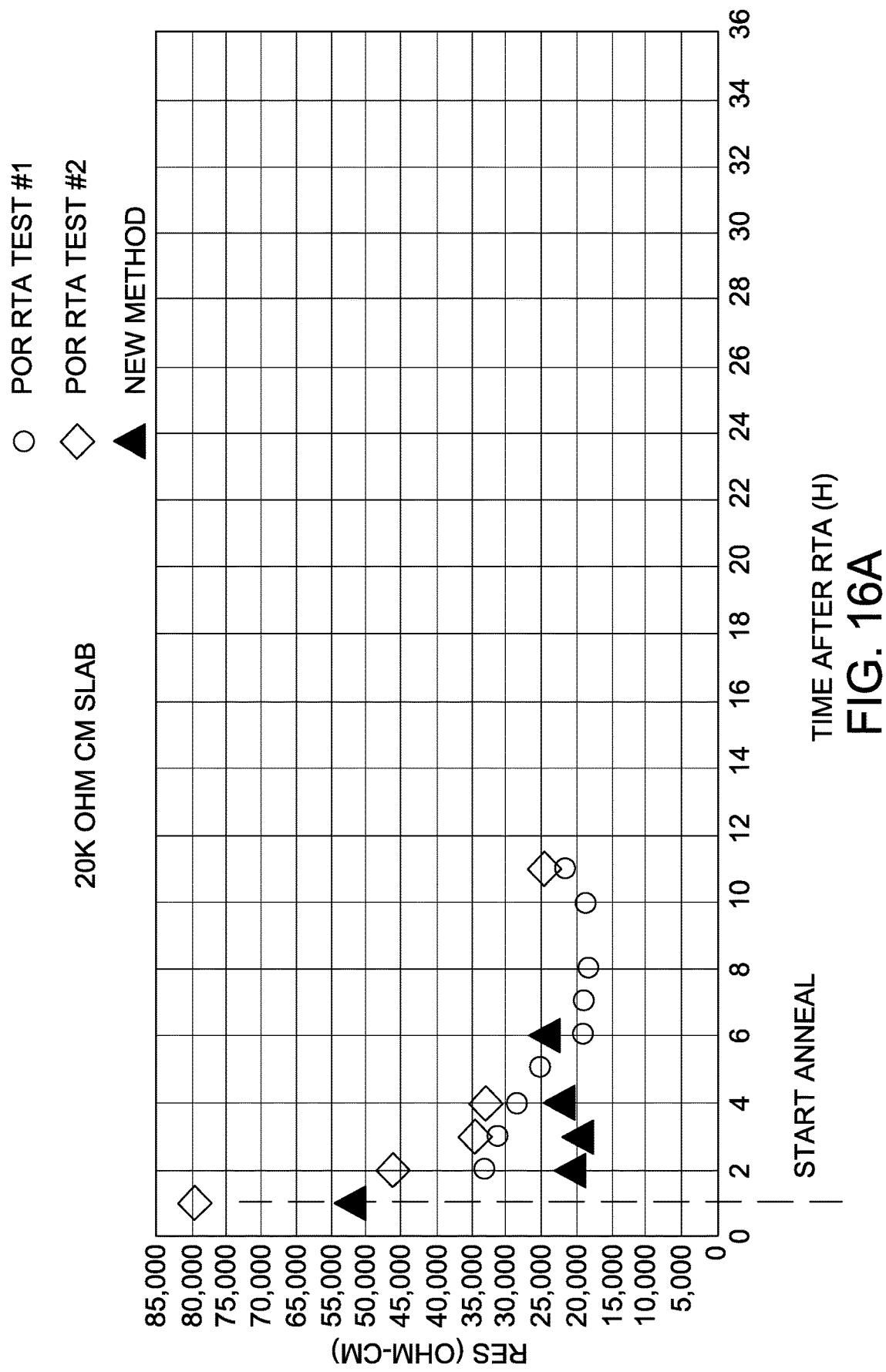
FIG. 16A is a graph comparing resistivity relaxation on a fat neck center slab ~20K ohm cm with IR irradiation (New method) and without (POR Test #1 and #2). IR irradiation anneal was started 1 hr after thermal donor annihilation anneal.
Figure 16B:
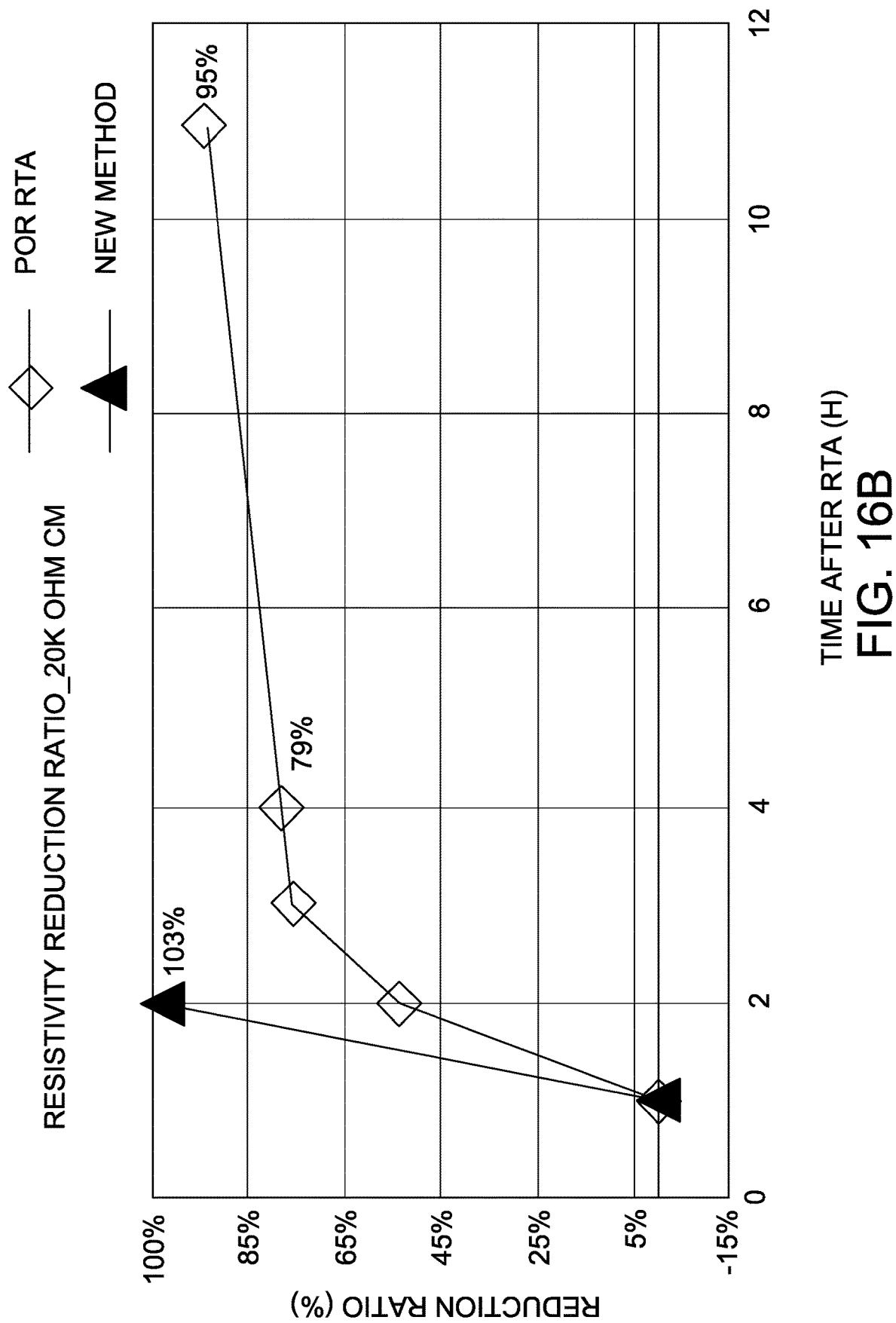
FIG. 16B is a graph depicting the relative resistivity reduction vs. time for the center slabs with IR irradiation (New Method) and without (POR test #2) for 20K center slabs.

Additional sample rods were grown with target resistivities of 5,000 ohm-cm and 20,000 ohm-cm. Center slabs were sliced from each and subjected to thermal donor annihilation anneal at 720° C. for 2 minutes. Thereafter, the center slabs were lapped in a carrier under 10 kg weight pressure. One center slab from each sample rod was allowed to relax and stabilize resistivity for 32 hours. A second center slab from each sample rod was irradiated in infrared light to a temperature at least 50° C. for 60 minutes. FIG. 15A is a graph comparing resistivity relaxation on a fat neck center slab ~5K ohm cm with IR irradiation (New method) and without (POR Test #1 and #2). IR irradiation anneal was started 1 hr after thermal donor annihilation anneal. FIG. 15B is a graph depicting the relative resistivity reduction vs. time for the fat neck center slabs with IR irradiation (New Method) and without (POR test #2) for 5K fat neck slabs. FIG. 16A is a graph comparing resistivity relaxation on a fat neck center slab ~20K ohm cm with IR irradiation (New method) and without (POR Test #1 and #2). IR irradiation anneal was started 1 hr after thermal donor annihilation anneal. FIG. 16B is a graph depicting the relative resistivity reduction vs. time for the fat neck center slabs with IR irradiation (New Method) and without (POR test #2) for 20K fat neck slabs. The results clearly show that a 1 hour low temperature anneal is more than sufficient to relax the resistivity to near 100% saturation, whereas on the POR process, a 12 hour wait post RTA/lap can achieve ~95% of the final resistivity.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method of growing a single crystal silicon ingot, the method comprising:
    contacting a silicon seed crystal with a silicon melt, wherein the silicon melt is contained within a crucible and comprises molten silicon;
    withdrawing the silicon seed crystal from the silicon melt to form a sample rod comprising single crystal silicon, the sample rod having a cylindrical main body and comprising a central axis; a circumferential edge; and a constant diameter, wherein the constant diameter is between 5 millimeters and 150 millimeters and further wherein the sample rod has a length between 100 millimeters and 500 millimeters;
    slicing a slab from the sample rod, the slab comprising a longitudinal plane encompassing at least a portion of the central axis of the sample rod and having a thickness;
    annealing the slab to annihilate thermal donors, wherein the slab is annealed at a temperature of at least 500° C. for no more than 60 minutes;
    after annealing the slab, lapping the slab;
    after lapping the slab, irradiating the slab with infrared light for between 10 minutes and one hour to enhance a resistivity relaxation rate of the slab;
    measuring a resistivity of the slab after irradiating the slab and after the slab has a temperature of less than 30° C.; and
    growing the single crystal silicon ingot from the silicon melt.

2. The method of claim 1 wherein the single crystal silicon ingot has a resistivity of at least about 500 Ω-cm.

3. The method of claim 1 further comprising, after measuring the resistivity of the slab having the temperature of less than 30° C.:
    adding a dopant to the silicon melt; and
    growing a single crystal silicon ingot from the silicon melt having a resistivity different from the resistivity of the sample rod.

4. The method of claim 3 wherein the single crystal silicon ingot has a resistivity of at least 500 Ω-cm.

5. The method of claim 3 wherein the single crystal silicon ingot is a p-type single crystal silicon ingot and the added dopant is selected from the group consisting of phosphorus, arsenic, and antimony and wherein the dopant is added to increase the resistivity of the p-type single crystal silicon ingot.

6. The method of claim 5 wherein the single crystal silicon ingot has a resistivity of at least about 500 Ω-cm.

7. The method of claim 1 wherein the central axis of the sample rod is between 100 millimeters and 500 millimeters in length.

8. The method of claim 1 wherein the diameter of the sample rod is less than 150 mm.

9. The method of claim 1 wherein the thickness of the slab is between 1 millimeter and 3 millimeter.

10. The method of claim 1 wherein the anneal to annihilate thermal donors comprises annealing the slab at a temperature greater than 600° C. for at least 1 minute and no more than 30 minutes.

11. The method of claim 1 wherein the anneal to annihilate thermal donors comprises annealing the slab at a temperature of 720° C. for two minutes.

12. The method of claim 1 wherein the slab is irradiated with light having a wavelength between 0.75 micrometers and 1000 micrometers.

13. The method of claim 1 wherein the slab is irradiated with light at an intensity sufficient to increase a temperature of the slab to a temperature of 50° C.

14. The method of claim 13 wherein the slab is irradiated at the temperature of 50° C. for at least 10 minutes.

15. The method of claim 1 wherein the slab is irradiated at a temperature of between 40° C. and 60° C. for between 10 minutes and one hour.

16. The method of claim 1 wherein the resistivity of the slab is measured at a plurality of points along the central axis.

17. The method of claim 1 further comprising, before measuring the resistivity of the slab and after irradiating the slab, cooling the slab to the temperature of less than 30° C., wherein a duration of the cooling is less than 30 minutes.

* * * * *